(12) United States Patent
Hong

(10) Patent No.: US 12,288,838 B2
(45) Date of Patent: Apr. 29, 2025

(54) UNIT PIXEL HAVING LIGHT EMITTING DEVICE, PIXEL MODULE AND DISPLAYING APPARATUS

(71) Applicant: Seoul Semiconductor Co., Ltd., Ansan-si (KR)

(72) Inventor: Seung Sik Hong, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 18/674,129

(22) Filed: May 24, 2024

(65) Prior Publication Data

US 2024/0313186 A1 Sep. 19, 2024

Related U.S. Application Data

(63) Continuation of application No. 18/347,165, filed on Jul. 5, 2023, now Pat. No. 12,009,468, which is a
(Continued)

(51) Int. Cl.
*H01L 33/62* (2010.01)
*H01L 25/075* (2006.01)
*H01L 33/58* (2010.01)

(52) U.S. Cl.
CPC .......... *H01L 33/62* (2013.01); *H01L 25/0753* (2013.01); *H01L 33/58* (2013.01)

(58) Field of Classification Search
CPC ..... H01L 33/62; H01L 25/0753; H01L 33/58; H01L 33/486; H01L 33/54; H01L 33/483; H01L 33/52
See application file for complete search history.

(56) References Cited

U.S. PATENT DOCUMENTS 8,933,433 B2 * 1/2015 Higginson .............. H01L 33/44
257/14
9,442,284 B2 9/2016 Kim et al.
(Continued)

FOREIGN PATENT DOCUMENTS

CN 108388379 A 8/2018
JP 2013-026510 2/2013
(Continued)

OTHER PUBLICATIONS

Non-Final Office Action dated Jan. 5, 2022, issued to U.S. Appl. No. 16/831,973.9.
(Continued)

*Primary Examiner* — Victor A Mandala
(74) *Attorney, Agent, or Firm* — Oblon, McClelland, Maier & Neustadt, L.L.P.

(57) ABSTRACT

A display apparatus including a panel substrate and a pixel module disposed thereon, in which the pixel module includes a circuit board and light emitters arranged and aligned in a first direction and disposed on the circuit board, in which each light emitter includes a light emitting layer including a first and a second conductivity type semiconductor layer, and an active layer interposed therebetween, a first and a second connection layer electrically connected to the first and the second conductivity type semiconductor layer, respectively, and a step adjustment layer disposed between the circuit board and the light emitting layer and covering a region of the light emitting layer and including an opening region configured to provide an electrical contact region between the first connection layer and the first conductivity type semiconductor layer.

20 Claims, 29 Drawing Sheets

Related U.S. Application Data continuation of application No. 17/833,734, filed on Jun. 6, 2022, now Pat. No. 11,742,472, which is a continuation of application No. 16/831,973, filed on Mar. 27, 2020, now Pat. No. 11,355,686.

(60) Provisional application No. 62/826,033, filed on Mar. 29, 2019.

(56) References Cited

U.S. PATENT DOCUMENTS

| | | | |
|---|---|---|---|
| 9,698,128 B2 | 7/2017 | Moriguchi et al. | |
| 10,734,363 B2* | 8/2020 | Andrews | H01L 33/60 |
| 10,964,581 B1* | 3/2021 | Torrents Abad | H01L 33/0093 |
| 11,282,820 B2 | 3/2022 | Takeya et al. | |
| 11,569,425 B2* | 1/2023 | Bower | B41F 16/00 |
| 11,727,857 B2* | 8/2023 | Hussell | H01L 33/64 |
| | | | 257/99 |
| 11,790,831 B2* | 10/2023 | Hussell | H01L 33/486 |
| | | | 315/294 |
| 2014/0061685 A1* | 3/2014 | Jeong | H01L 27/153 |
| | | | 257/88 |
| 2014/0209930 A1* | 7/2014 | Weng | H01L 27/15 |
| | | | 438/26 |
| 2014/0312368 A1* | 10/2014 | Lee | H01L 27/156 |
| | | | 257/89 |
| 2015/0247627 A1* | 9/2015 | Cope | G09F 9/3026 |
| | | | 362/249.08 |
| 2015/0333241 A1* | 11/2015 | Chen | H01L 33/62 |
| | | | 257/93 |
| 2016/0351764 A1 | 12/2016 | Cha et al. | |
| 2016/0351767 A1* | 12/2016 | Choi | H01L 25/167 |
| 2017/0250318 A1* | 8/2017 | Cha | H01L 33/504 |
| 2018/0145224 A1* | 5/2018 | Kim | H01L 33/62 |
| 2019/0019780 A1* | 1/2019 | Kim | H01L 33/62 |
| 2019/0074206 A1 | 3/2019 | Chen | |
| 2019/0074266 A1* | 3/2019 | Andrews | H01L 23/60 |
| 2019/0189853 A1* | 6/2019 | Yoo | H01L 33/385 |
| 2019/0229097 A1* | 7/2019 | Takeya | H01L 33/0093 |
| 2019/0304960 A1* | 10/2019 | Ko | H01L 24/06 |
| 2019/0326349 A1* | 10/2019 | Kwon | H01L 33/56 |
| 2020/0227394 A1* | 7/2020 | Yeh | H01L 23/5384 |
| 2020/0274039 A1* | 8/2020 | Chen | H01L 25/0753 |
| 2021/0194217 A1* | 6/2021 | Carson | H01S 5/18327 |

FOREIGN PATENT DOCUMENTS

| | | | | |
|---|---|---|---|---|
| JP | 2015-197544 A | 11/2015 | | |
| KR | 10-2013-0143300 | 12/2013 | | |
| KR | 10-2015-0007853 | 1/2015 | | |
| KR | 10-2019-0003198 A | 1/2019 | | |
| KR | 10-2019-0026617 | 3/2019 | | |
| KR | 10-2019-0026617 A | * | 3/2019 | 25/75 |

OTHER PUBLICATIONS

Notice of Allowance dated Apr. 14, 2022, issued to U.S. Appl. No. 16/831,973.
European Search Report dated Dec. 9, 2022, issued to European Patent Application No. 20784459.8.
Japanese Office Action issued Nov. 21, 2023 in Japanese Application 2021-552961, citing documents 1 & 15-16 therein, 4 pages.
Combined Chinese Office Action and Search Report issued Nov. 23, 2023 in Chinese Patent Application No. 202080023986.8, citing references 17 and 18 therein, 9 pages.

* cited by examiner

UNIT PIXEL HAVING LIGHT EMITTING DEVICE, PIXEL MODULE AND DISPLAYING APPARATUS

CROSS-REFERENCE TO RELATED APPLICATIONS

This application is a Continuation of U.S. patent application Ser. No. 18/347,165 filed on Jul. 5, 2023, which is a continuation of U.S. patent application Ser. No. 17/833,734, filed on Jun. 6, 2022, which is a continuation of U.S. patent application Ser. No. 16/831,973, filed on Mar. 27, 2020, which claims the benefit of U.S. Provisional Application No. 62/826,033, filed on Mar. 29, 2019, each of which is hereby incorporated in its entirety by reference for all purposes as set forth herein.

BACKGROUND

Field

Exemplary embodiments relate to a displaying apparatus, and more particularly, to a unit pixel having a light emitting device, a pixel module having the same, and a displaying apparatus having the same.

Discussion of the Background

Light emitting devices are semiconductor devices using light emitting diodes, which are inorganic light sources, and are used in various technical fields, such as displaying apparatuses, automobile lamps, general lighting, and the like. Light emitting diodes have advantages such as longer lifespan, lower power consumption, and fast response than existing light sources, and thus, light emitting diodes have been replacing the existing light sources.

The conventional light emitting diodes have been generally used as backlight light sources in display apparatuses. However, displaying apparatuses that directly realize images using the light emitting diodes have been recently developed. Such displays are also referred to as micro LED displays.

In general, a displaying apparatus displays various colors through mixture of blue, green, and red light. In order to realize various images, the displaying apparatus includes a plurality of pixels, each including sub-pixels corresponding to one of blue, green, and red light. As such, a color of a certain pixel is typically determined based on the colors of the sub-pixels, so that images can be realized through the combination of such pixels.

In the case of the micro LED display, a micro LED is arranged on a two-dimensional plane corresponding to each sub-pixel, and, accordingly, a large number of micro LEDs need to be arranged on a single substrate. However, the micro LED is extremely small, for example, 200 μm or less, further 100 μm or less, and these small sizes cause various problems. In particular, it is difficult to handle the light emitting diodes having small sizes, and thus, it is not easy to directly mount the light emitting diodes on a display panel.

The above information disclosed in this Background section is only for understanding of the background of the inventive concepts, and, therefore, it may contain information that does not constitute prior art.

SUMMARY

Unit pixels constructed according to exemplary embodiments of the invention are capable of being mounted on a circuit board, and a display apparatus having the same.

Exemplary embodiments provide a unit pixel that has high reliability and a displaying apparatus having the same.

Exemplary embodiments also provide a unit pixel that prevents a failed light emitting device from being mounted and a displaying apparatus having the same.

Additional features of the inventive concepts will be set forth in the description which follows, and in part will be apparent from the description, or may be learned by practice of the inventive concepts.

A unit pixel according to an exemplary embodiment includes: a transparent substrate; a plurality of light emitting devices arranged on the transparent substrate; an adhesive layer bonding the light emitting devices to the transparent substrate; a step adjusting layer covering the light emitting device and bonded to the adhesive layer; connection layers disposed on the step adjustment layer, and electrically connected to the light emitting devices, in which the step adjustment layer has a concave-convex pattern along an edge thereof.

A unit pixel according to another exemplary embodiment includes: a transparent substrate; at least three light emitting devices arranged on the transparent substrate and emitting light of different colors; an adhesive layer bonding the light emitting devices to the transparent substrate; a step adjusting layer covering the light emitting device and bonded to the adhesive layer; connection layers disposed on the step adjustment layer, and electrically connected to the light emitting devices, in which the at least three light emitting devices are arranged in a line.

A pixel module according to another exemplary embodiment includes: a circuit board; a plurality of unit pixels disposed on the circuit board; and a cover layer covering the plurality of unit pixels, each of the unit pixels including: a transparent substrate; a plurality of light emitting devices arranged on the transparent substrate; an adhesive layer bonding the light emitting devices to the transparent substrate; a step adjusting layer covering the light emitting device and bonded to the adhesive layer; connection layers disposed on the step adjustment layer, and electrically connected to the light emitting devices, in which the step adjustment layer has a concave-convex pattern along an edge thereof.

A displaying apparatus according to another exemplary embodiment includes: a panel substrate; and a plurality of pixel modules arranged on the panel substrate, each of the pixel modules including: a circuit board; a plurality of unit pixels disposed on the circuit board; and a cover layer covering the plurality of unit pixels, in which each of the unit pixels includes: a transparent substrate; a plurality of light emitting devices arranged on the transparent substrate; an adhesive layer bonding the light emitting devices to the transparent substrate; a step adjusting layer covering the light emitting device and bonded to the adhesive layer; connection layers disposed on the step adjustment layer, and electrically connected to the light emitting devices, and the step adjustment layer has a concave-convex pattern along an edge thereof.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
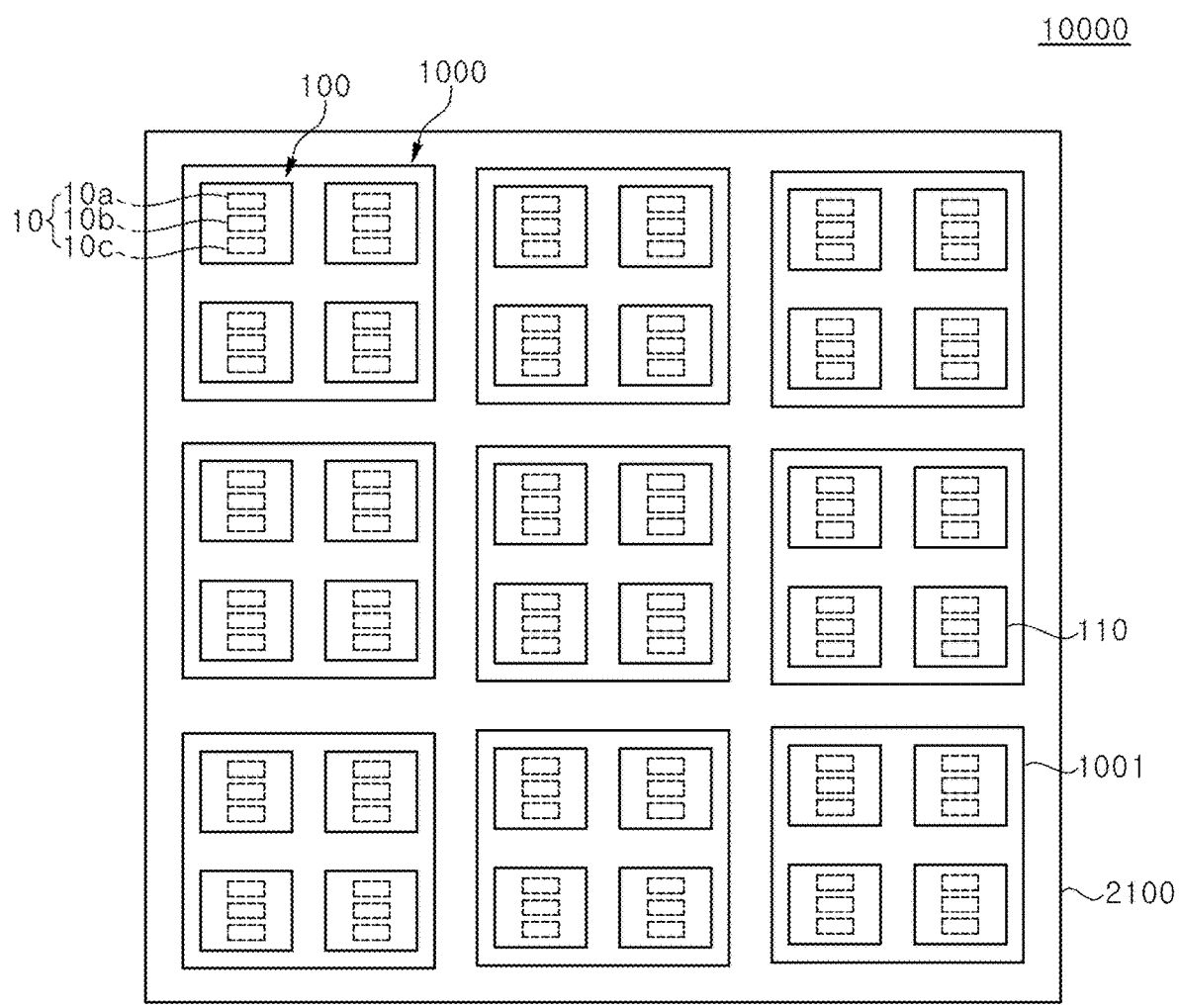
FIG. 1 is a schematic plan view illustrating a displaying apparatus according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

A unit pixel according to an exemplary embodiment includes: a transparent substrate; a plurality of light emitting devices arranged on the transparent substrate; an adhesive layer bonding the light emitting devices to the transparent substrate; a step adjusting layer covering the light emitting device and bonded to the adhesive layer; connection layers disposed on the step adjustment layer, and electrically connected to the light emitting devices, in which the step adjustment layer has a concave-convex pattern along an edge thereof.

The plurality of light emitting devices may include at least three light emitting devices emitting light of different colors, and the at least three light emitting devices may be arranged in a line.

The plurality of light emitting devices may further include light emitting devices emitting red, green, and blue light.

Each of the light emitting devices may include a light emitting structure including a first conductivity type semiconductor layer, a second conductivity type semiconductor layer and an active layer interposed between the first and second conductivity type semiconductor layers; and a first electrode pad and a second electrode pad disposed on the light emitting structure, in which the step adjustment layer may have openings exposing the first and second electrode pads, and the connection layers may be electrically connected to the first and second electrode pads through the openings of the step adjustment layer.

Each of the light emitting devices may include a plurality of connection tips.

Connection tips of any one of the light emitting devices may be arranged at different locations from those of connection tips of remaining light emitting devices.

The plurality of connection tips arranged on each light emitting device may be disposed to be asymmetrical with respect to at least one arrangement direction.

The unit pixel may further include a light blocking layer disposed between the adhesive layer and the transparent substrate, and the light blocking layer may have a window that transmits light generated in the light emitting device.

A width of the window may be smaller than that of the light emitting device according to an exemplary embodiment. The width of the window may be wider than that of the light emitting device according to another exemplary embodiment.

The unit pixel may further include a protection layer covering the step adjustment layer and the contact layers, and the protection layer may have openings located on the contact layers.

The unit pixel may further include bumps disposed in openings of the protection layer, and the bumps may be electrically connected to the contact layers, respectively.

A unit pixel according to another exemplary embodiment includes: a transparent substrate; at least three light emitting devices arranged on the transparent substrate, and emitting light of different colors; an adhesive layer bonding the light emitting devices to the transparent substrate; a step adjusting layer covering the light emitting device and bonded to the adhesive layer; connection layers disposed on the step adjustment layer, and electrically connected to the light emitting devices, in which the at least three light emitting devices are arranged in a line.

The transparent substrate may be a sapphire substrate.

A pixel module according to an exemplary embodiment includes: a circuit board; a plurality of unit pixels disposed on the circuit board; and a cover layer covering the plurality of unit pixels, each of the unit pixels including: a transparent substrate; a plurality of light emitting devices arranged on the transparent substrate; an adhesive layer bonding the light emitting devices to the transparent substrate; a step adjusting layer covering the light emitting device and bonded to the adhesive layer; connection layers disposed on the step adjustment layer, and electrically connected to the light emitting devices, in which the step adjustment layer has a concave-convex pattern along an edge thereof.

The unit pixel may further include a protection layer covering the step adjustment layer and the contact layers, and the protection layer may have openings located on the contact layers.

The pixel module, according to an exemplary embodiment, may further include a bonding material bonding the light emitting devices and the circuit board, and the bonding material may fill at least a portion of the openings of the protection layer.

The pixel module, according to another exemplary embodiment, may further include a bonding material bonding the light emitting devices and the circuit board, in which the unit pixel may further include bumps disposed in the openings of the protection layer, the circuit board may include pads exposed on an upper surface thereof, and the bonding material may bond the bumps with the pads.

The circuit board may further include bottom pads disposed on a bottom thereof, and the number of the bottom pads may be smaller than that of the pads. For example, the number of the bottom pads may be ½ of the number of the pads.

The plurality of light emitting devices may include at least three light emitting devices emitting light of different colors, and the at least three light emitting devices may be arranged in a line.

A displaying apparatus according to an exemplary embodiment includes: a panel substrate; and a plurality of pixel modules arranged on the panel substrate, each of the pixel modules including: a circuit board; a plurality of unit pixels disposed on the circuit board; and a cover layer covering the plurality of unit pixels, in which each of the unit pixels includes: a transparent substrate; a plurality of light emitting devices arranged on the transparent substrate; an adhesive layer bonding the light emitting devices to the transparent substrate; a step adjusting layer covering the light emitting device and bonded to the adhesive layer; connection layers disposed on the step adjustment layer, and electrically connected to the light emitting devices, in which the step adjustment layer has a concave-convex pattern along an edge thereof.

Hereinafter, exemplary embodiments will be described in detail with reference to the accompanying drawings.

FIG. 1 is a schematic plan view illustrating a displaying apparatus according to an exemplary embodiment.

Referring to FIG. 1, a displaying apparatus 10000 includes a panel substrate 2100 and a plurality of pixel modules 1000.

The panel substrate 2100 may include a circuit for a passive matrix driving or active matrix driving manner. In an exemplary embodiment, the panel substrate 2100 may include wirings and resistors therein, and, in another exemplary embodiment, the panel substrate 2100 may include wirings, transistors, and capacitors. The panel substrate 2100 may also have pads disposed on at least one surface thereof for electrical connection to the circuit.

A plurality of pixel modules 1000 is arranged on the panel substrate 2100. Each pixel module 1000 may include a circuit board 1001 (see also FIG. 4A), and a plurality of unit pixels 100 disposed on the circuit board 1001.

Each unit pixel 100 includes a plurality of light emitting devices 10. The light emitting devices 10 may include light emitting devices 10a, 10b, and 10c that emit light having different colors. The light emitting devices 10a, 10b, and 10c in each unit pixel 100 may be arranged in a line as shown in FIG. 1. In particular, the light emitting devices 10a, 10b, and 10c may be arranged in a vertical direction with respect to a display screen, on which the image is displayed.

Hereinafter, each element of the displaying apparatus 10000 will be described in more detail in the order of the light emitting device 10, the unit pixel 100, and the pixel module 1000 that are disposed in the displaying apparatus 10000.

Figure 2A:
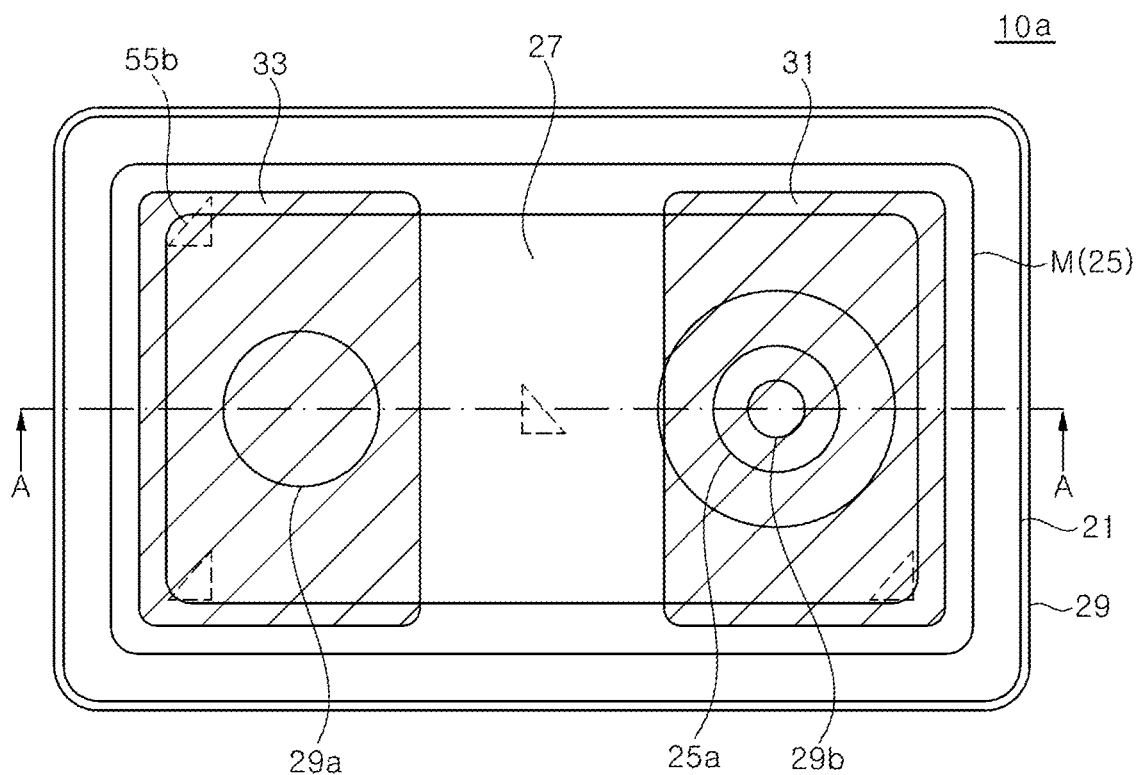
FIG. 2A is a schematic plan view illustrating a light emitting device according to an exemplary embodiment.
Figure 2B:
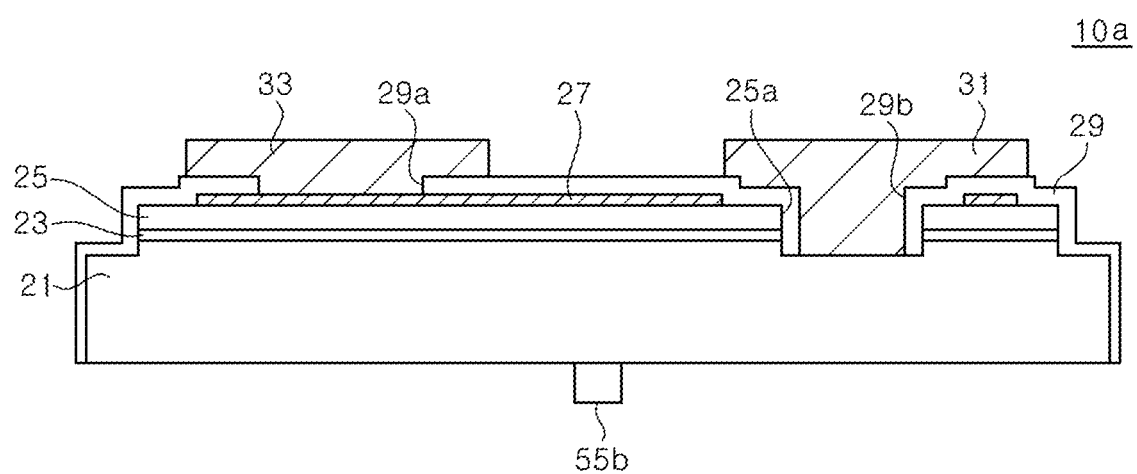
FIG. 2B is a schematic cross-sectional view taken along line A-A of FIG. 2A.

FIG. 2A is a schematic plan view illustrating a light emitting device according to an exemplary embodiment, and FIG. 2B is a schematic cross-sectional view taken along line A-A of FIG. 2A. Hereinafter, although the light emitting device shown in FIGS. 2A and 2B will be described with reference to the light emitting device 10a, the light emitting devices 10b and 10c according to an exemplary embodiment may have substantially the same structure as the light emitting device 10a shown in FIGS. 2A and 2B.

Referring to FIG. 2A and FIG. 2B, the light emitting devices 10a includes a light emitting structure including a first conductivity type semiconductor layer 21, an active layer 23, and a second conductivity type semiconductor layer 25. In addition, the light emitting device 10a may include an ohmic contact layer 27, an insulation layer 29, a first electrode pad 31, and a second electrode pad 33. Connection tips 55b may be disposed on a side of the first conductivity type semiconductor layer 21 that opposes a side on which the first electrode pad 33 and the second electrode pad 33 are disposed.

The light emitting structure including the first conductivity type semiconductor layer 21, the active layer 23, and the second conductivity type semiconductor layer 25 may be grown on a substrate. The substrate may be one of various substrates that may grow semiconductors thereon, such as gallium nitride substrate, GaAs substrate, Si substrate, and sapphire substrate, especially patterned sapphire substrate. The growth substrate may be separated from the semiconductor layers using a process, such as a mechanical grinding, a laser lift off, a chemical lift off process, or the like. However, the inventive concepts are not limited thereto, and, in some exemplary embodiments, a portion of the substrate may be retained to be disposed on the first conductivity type semiconductor layer 21.

When the light emitting device 10a emits red light according to an exemplary embodiment, the semiconductor layers may include aluminum gallium arsenide (AlGaAs), gallium arsenide phosphide (GaAsP), aluminum gallium indium phosphide (AlGaInP), or gallium phosphide (GaP).

When the light emitting device 10b emits green light according to an exemplary embodiment, the semiconductor layers may include indium gallium nitride (InGaN), gallium nitride (GaN), gallium phosphide (GaP), aluminum gallium indium phosphide (AlGaInP), or aluminum gallium phosphide. (AlGaP).

When the light emitting device 10c emits blue light according to an exemplary embodiment, the semiconductor layers may include gallium nitride (GaN), indium gallium nitride (InGaN), or zinc selenide (ZnSe).

The first conductivity type and the second conductivity type may have opposite polarities. For example, when the first conductivity type is an n-type, the second conductivity type may be a p-type, and, when the second conductivity type is a p-type, the second conductivity type may be an n-type.

The first conductivity type semiconductor layer 21, the active layer 23, and the second conductivity type semiconductor layer 25 may be grown on the substrate in a chamber using a known process, such as metal organic chemical vapor deposition (MOCVD) process. In addition, the first conductivity type semiconductor layer 21 may include n-type impurities (e.g., Si, Ge, and Sn), and the second conductivity type semiconductor layer 25 may include p-type impurities (e.g., Mg, Sr, and Ba). In an exemplary embodiment, the first conductivity type semiconductor layer 21 may include GaN or AlGaN containing Si as a dopant, and the second conductivity type semiconductor layer 25 may include GaN or AlGaN containing Mg as a dopant.

Although the first conductivity type semiconductor layer 21 and the second conductivity type semiconductor layer 25 are shown as single layers in the drawings, these layers may be multiple layers, and may also include a superlattice layer. The active layer 23 may include a single quantum well structure or a multiple quantum well structure, and a composition ratio of a nitride-based semiconductor may be adjusted to emit a desired wavelength. For example, the active layer 23 may emit blue light, green light, red light, or ultraviolet light.

The second conductivity type semiconductor layer 25 and the active layer 23 may have a mesa M structure, and may be disposed on the first conductivity type semiconductor layer 21. The mesa M may include the second conductivity type semiconductor layer 25 and the active layer 23, and may include a portion of the first conductivity type semiconductor layer 21 as shown in FIG. 2B. The mesa M may be disposed on the portion of the first conductivity type semiconductor layer 21, and an upper surface of the first conductivity type semiconductor layer 21 may be exposed around the mesa M.

The first conductivity type semiconductor layer 21 may have a concave-convex pattern from surface texturing. Surface texturing may be performed by patterning, for example, using a dry etching process. For example, cone-shaped protrusions each having an elevation of about 2.5 μm to about 3 μm may be formed. A distance between the cones may be about 1.5 μm to about 2 μm, and a diameter of a bottom of the cone may be about 3 μm. Color difference may be reduced by forming the concave-convex pattern on the surface of the first conductivity type semiconductor layer 21. Surface texturing may be performed on the first conductivity type semiconductor layers in each of the first, second, and third light emitting devices 10a, 10b, and 10c, but the inventive concepts are not limited thereto. In some exemplary embodiments, surface texturing may not be performed in some of the light emitting devices.

When the first, second, and third light emitting devices 10a, 10b, and 10c are arranged in a line in a unit pixel 100 which will be described later, color difference between the left and right of a pixel may be reduced by including the surface-textured first conductivity type semiconductor layer 21.

The mesa M may have a through hole 25a exposing the first conductivity type semiconductor layer 21. The through hole 25a may be disposed close to one edge of the mesa M, without being limited thereto. In some exemplary embodiments, the through hole 25a may be disposed at a center of the mesa M.

The ohmic contact layer 27 is disposed on the second conductivity type semiconductor layer 25 to be in ohmic contact with the second conductivity type semiconductor layer 25. The ohmic contact layer 27 may be formed of a single layer or multiple layers, and may be formed of a transparent conductive oxide film or a metal film. For example, the transparent conductive oxide film may include ITO, ZnO, or the like, and the metal film may include metal, such as Al, Ti, Cr, Ni, Au, or the like and an alloy thereof.

The insulation layer 29 covers the mesa M and the ohmic contact layer 27. The insulation layer 29 may further cover upper and side surfaces of the first conductivity type semiconductor layer 21 exposed around the mesa M. The insulation layer 29 may have an opening 29a exposing the ohmic contact layer 27, and an opening 29b exposing the first conductivity type semiconductor layer 21 in the through hole 25a. The insulation layer 29 may be formed of a single layer or multiple layers of a silicon oxide film or a silicon nitride film. The insulation layer 29 may also include an insulation reflector, such as a distributed Bragg reflector.

The first electrode pad 31 and the second electrode pad 33 are disposed on the insulation layer 29. The second electrode pad 33 may be electrically connected to the ohmic contact layer 27 through the opening 29a, and the first electrode pad 31 may be electrically connected to the first conductivity type semiconductor layer 21 through the opening 29b.

The first and/or second electrode pads 31 and 33 may be formed of a single layer or a multiple layer of metal. As a material of the first and/or second electrode pads 31 and 33, metal such as Al, Ti, Cr, Ni, Au, or the like and an alloy thereof may be used.

The connection tips 55b may be formed on the light emitting device 10a. As shown in FIG. 2A, four connection tips 55b may be disposed on the light emitting structure.

For example, one connection tip 55b may be disposed at approximately a center of the light emitting device 10a, two connection tips 55b may be disposed at a location overlapping with the second electrode pad 33, and one connection tip 55b may be disposed at a location overlapping with the first electrode pad 31. Three connection tips 55b may be disposed in substantially a triangular shape near outline of the light emitting device 10a, and one connection tip 55b disposed at the center of the light emitting device 10a may be located in the triangle formed by the three connection tips 55b.

The two connection tips 55b disposed at the location overlapping with the second electrode pad 33 may be disposed near one edge of the second electrode pad 33, and may be disposed to face each other with respect to an elongated straight line passing through the center.

The connection tip 55b disposed at the location overlapping with the first electrode pad 31 may be disposed near one edge of the first electrode pad 31, and may be disposed away from the elongated straight line passing through the center.

Each of the connection tips 55b may have substantially a right triangular shape, and the connection tip 55b disposed at the center of the light emitting device 10 may be arranged in a direction opposite to the other connection tips 55b as shown in the drawing.

When the light emitting devices 10 are separated from a connection portion using the connection tips 55b, the connection tip 55b overlapping with the first electrode pad 31 may be formed first, then the connection tip 55b near the center may be formed, and, finally, the connection tips 55b overlapping with the second electrode pad 33 may be formed. As such, the light emitting devices 10 may be easily separated from the connection portion, and cracks which may otherwise occur in the light emitting devices may be prevented.

When picking up or mounting the light emitting device 10a, for example, the light emitting device 10a may be unstably picked up or mounted due to the location of the connection tips, and thus, cracks may occur. In contrast, since the connection tips 55b according to an exemplary embodiment are arranged on both edges of the light emitting device 10a and near the center of the light emitting device 10a, respectively, the light emitting device 10a may be picked up or mounted stably and thereby preventing cracks generated in the light emitting device 10a.

A total area of the four connection tips 55b may be about 0.8% of a planar area of the light emitting device 10a according to the exemplary embodiment.

Although the locations of the connection tips 55b have been briefly described with reference to FIG. 2A and FIG. 2B, the inventive concepts are not limited thereto. In some exemplary embodiments, the connection tips 55b may be arranged in various shapes at various locations. In addition, the light emitting devices 10a, 10b, and 10c may include the connection tips 55b disposed at the same locations, but the inventive concepts are not limited thereto. For example, the connection tips 55b disposed on the first light emitting device 10a may be disposed at locations different from those disposed on the second and third light emitting devices 10b and 10c. The locations and formation of the connection tips 55b and a method of transferring the light emitting devices 10 will be described later.

Although the light emitting device 10a according to an exemplary embodiment has been briefly described with reference to the drawings, the light emitting device 10a may further include a layer having additional functions in addition to the above-described layers. For example, various layers such as a reflective layer for reflecting light, an additional insulation layer for insulating a specific element, and a solder preventing layer for preventing diffusion of solder may be further included.

When a flip chip type light emitting device is formed, the mesa may be formed to have various shapes, and the locations and shapes of the first and second electrode pads 31 and 33 may also be variously modified. In addition, the ohmic contact layer 27 may be omitted, and the second electrode pad 33 may directly contact the second conductivity type semiconductor layer 25. Although the first electrode pad 31 is shown as being directly connected to the first conductivity type semiconductor layer 21 in FIG. 2B, in some exemplary embodiments, a contact layer may be formed first on the first conductivity type semiconductor layer 21 exposed to the through hole 25a, and the first electrode pad 31 may be connected to the contact layer.

Figure 3A:
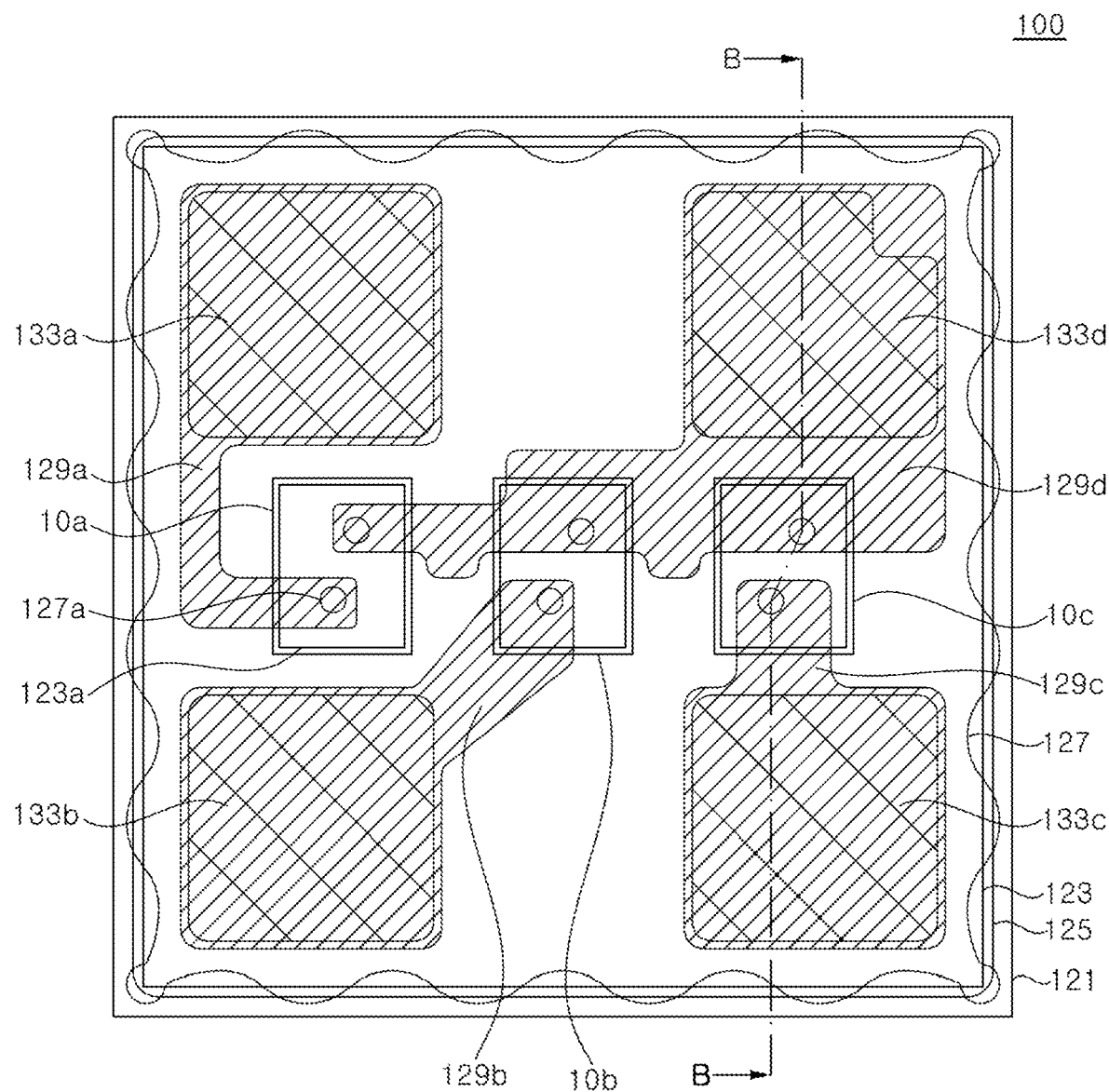
FIG. 3A is a schematic plan view illustrating a unit pixel according to an exemplary embodiment.
Figure 3B:
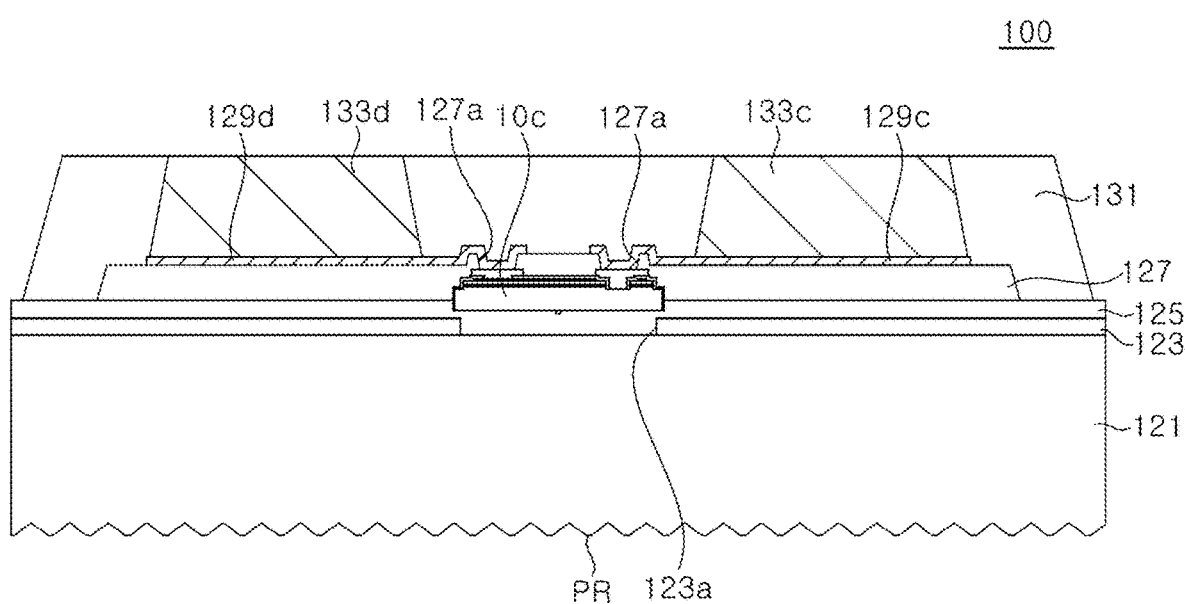
FIG. 3B is a schematic cross-sectional view taken along line B-B of FIG. 3A.

FIG. 3A is a schematic plan view illustrating a unit pixel 100 according to an exemplary embodiment, and FIG. 3B is a schematic cross-sectional view taken along line B-B of FIG. 3A.

Referring to FIG. 3A and FIG. 3B, the unit pixel 100 may include a transparent substrate 121, a first, second, and third light emitting devices 10a, 10b, and 10c, a light blocking layer 123, and an adhesive layer 125, a step adjustment layer 127, connection layers 129a, 129b, 129c, and 129d, bumps 133a, 133b, 133c, and 133d, and a protection layer 131.

The unit pixel 100 provides a single pixel including the first, second, and third light emitting devices 10a, 10b, and 10c. The first, second, and third light emitting devices 10a, 10b, and 10c emit light having different colors, and the first, second, and third light emitting devices 10a, 10b, and 10c correspond to sub-pixels, respectively.

The transparent substrate 121 is a light transmissive substrate, such as PET, glass substrate, quartz, sapphire substrate, or the like. The transparent substrate 121 is disposed on a light emitting surface of the displaying apparatus 10000 of FIG. 1, and light emitted from the light emitting devices 10a, 10b, and 10c is emitted to the outside through the transparent substrate 121. The transparent substrate 121 may include a concave-convex PR on the light emitting surface. Light emission efficiency may be improved through the concave-convex PR, and more uniform light may be emitted due to the concave-convex PR. The transparent substrate 121 may also include an anti-reflection coating, or may include an antiglare layer, or may be antiglare treated. The transparent substrate 121 may have a thickness of, for example, about 50 μm to about 500 μm.

Since the transparent substrate 121 is disposed on the light emitting surface, the transparent substrate 121 may not include a circuit. However, the inventive concepts are not limited thereto, and, in some exemplary embodiments, the transparent substrate 121 may include the circuit.

Although a single unit pixel 100 is illustrated to be formed on a single transparent substrate 121, a plurality of unit pixels 1000 may be formed on the single transparent substrate 121.

The light blocking layer 123 may include an absorbing material which absorbs light, such as carbon black. The light absorbing material may prevent light generated in the light emitting devices 10a, 10b, and 10c from leaking in a region between the transparent substrate 121 and the light emitting devices 10a, 10b, and 10c toward a side surface thereof, and may improve contrast of a displaying apparatus.

The light blocking layer 123 may have a window 123a providing a route for light to progress, so that light generated in the light emitting devices 10a, 10b, and 10c is incident on the transparent substrate 121. A width of the window 123a may be less than that of the light emitting device, but is not limited thereto. In some exemplary embodiments, a width of the window 123a may be greater than or equal to the width of the light emitting device.

The window 123a of the light blocking layer 123 also defines an arrangement location of the light emitting devices 10a, 10b, and 10c. As such, separate arrangement markers for defining arrangement locations of the light emitting devices 10a, 10b, and 10c may be omitted. However, the inventive concepts are not limited thereto, and, in some exemplary embodiments, the arrangement markers may be disposed on the transparent substrate 121, or on the light blocking layer 123 or the adhesive layer 125, to provide locations to arrange the light emitting devices 10a, 10b, and 10c.

The adhesive layer 125 is attached onto the transparent substrate 121. The adhesive layer 125 may cover the light blocking layer 123. The adhesive layer 125 may be attached to an entire surface of the transparent substrate 121, but is not limited thereto. In some exemplary embodiments, the adhesive layer 125 may be attached to a portion of the transparent substrate 121 to expose a region near an edge of the transparent substrate 121. The adhesive layer 125 is used to attach the light emitting devices 10a, 10b, and 10c to the transparent substrate 121. The adhesive layer 125 may fill the window 123a formed in the light blocking layer 123.

The adhesive layer 125 may be formed of a light transmissive layer, and transmits light emitted from the light emitting devices 10a, 10b, and 10c. The adhesive layer 125 may include a diffuser, such as $SiO_2$, $TiO_2$, ZnO, or the like to diffuse light. The light diffusing material prevents the light emitting devices 10a, 10b, and 10c from being observed from the light emitting surface.

The first, second, and third light emitting devices 10a, 10b, and 10c are disposed on the transparent substrate 121. The first, second, and third light emitting devices 10a, 10b, and 10c may be attached to the transparent substrate 121 by the adhesive layer 125. The first, second, and third light emitting devices 10a, 10b, and 10c may be disposed to correspond to the windows 123a of the light blocking layer 123. When the light blocking layer 123 is omitted, the arrangement markers may be added to provide the arrangement locations of the light emitting devices 10a, 10b, and 10c.

The first, second, and third light emitting devices 10a, 10b, and 10c may be, for example, green light emitting devices, red light emitting devices, and blue light emitting devices, respectively. Since specific configurations of each of the first, second, and third light emitting devices 10a, 10b, and 10c are substantially the same as those described with reference to FIG. 2A and FIG. 2B, repeated descriptions thereof will be omitted.

The first, second, and third light emitting devices 10a, 10b, and 10c may be arranged in a line, as shown in FIG. 3A. In particular, when the transparent substrate 121 is a sapphire substrate, the sapphire substrate may include clean-cut surfaces (e.g., m-plane) and non clean-cut surfaces (e.g., a-plane) due to a location of a crystal plane along a cutting direction. For example, when the sapphire substrate is cut into a quadrangular shape, two cutting planes on both sides thereof (e.g., m-plane) may be cut cleanly along the crystal plane, and two remaining cutting planes (e.g., a-plane) disposed in a direction perpendicular to the cutting planes may not cut cleanly. In this case, the clean-cut surfaces of the sapphire substrate 121 may be substantially flush with an arrangement direction of the light emitting devices 10*a*, 10*b*, and 10*c*. For example, in FIG. 3A, the clean-cut surfaces (e.g., m-plane) may be disposed up and down, and the two remaining cut surfaces (e.g., a-plane) may be disposed left and right. The clean-cut surfaces may be arranged on the left and right of a viewer who observes the display of FIG. 1.

The first, second, and third light emitting devices 10*a*, 10*b*, and 10*c* may have the structure described above with reference to FIG. 2A and FIG. 2B, but the inventive concepts are not limited thereto, and various light emitting devices having a lateral or flip chip structure may be used.

The step adjustment layer 127 covers the first, second, and third light emitting devices 10*a*, 10*b*, and 10*c*. The step adjustment layer 127 has openings 127*a* exposing the first and second electrode pads 31 and 33 of the light emitting devices 10*a*, 10*b*, and 10*c*. The step adjustment layer 127 may facilitate formation of the connection layers 129*a*, 129*b*, 129*c*, and 129*d* and the bumps 133*a*, 133*b*, 133*c*, and 133*d*. In particular, the step adjustment layer 127 may be formed to equalize elevations of locations where the bumps 133*a*, 133*b*, 133*c*, and 133*d* are to be formed. The step adjustment layer 127 may be formed of, for example, photosensitive polyimide.

The step adjustment layer 127 may have a concave-convex pattern along an edge thereof as shown in FIG. 3A. A shape of the concave-convex pattern may vary. A depth and a width of a concave portion formed to have the concave-convex pattern or a depth and a width of a convex portion therein may be adjusted. The concave-convex pattern formed on the step adjustment layer 127 may reduce compressive stress applied to the adhesive layer 125 by the step adjustment layer 127, and thus, may prevent peelings of the step adjustment layer 127 and the adhesive layer 125.

The step adjustment layer 127 may be formed to partially expose an edge of the adhesive layer 125 as illustrated in FIG. 3A, but the inventive concepts are not limited thereto. In particular, the step adjustment layer 127 may be disposed in a region surrounded by edges of the adhesive layer 125.

The connection layers 129*a*, 129*b*, 129*c*, and 129*d* are formed on the step adjustment layer 127. The connection layers 129*a*, 129*b*, 129*c*, and 129*d* may be connected to the first and second electrode pads 31 and 33 of the first, second, and third light emitting devices 10*a*, 10*b*, and 10*c* through the openings 127*a* of the step adjustment layer 127.

For example, the connection layer 129*a* may be electrically connected to a first conductivity type semiconductor layer of the first light emitting device 10*a*, the connection layer 129*b* may be electrically connected to a first conductivity of the second light emitting device 10*b*, the connection layer 129*c* may be electrically connected to a first conductivity type semiconductor layer of the third light emitting device 10*c*, and the connection layer 129*d* may be commonly electrically connected to second conductivity type semiconductor layers of the first, second, and third light emitting devices 10*a*, 10*b*, and 10*c*. The connection layers 129*a*, 129*b*, 129*c*, and 129*d* may be formed together on the step adjustment layer 127, and may include, for example, Au.

The bumps 133*a*, 133*b*, 133*c*, and 133*d* are formed on the connection layers 129*a*, 129*b*, 129*c*, and 129*d*, respectively. For example, the first bump 133*a* may be electrically connected to the first conductivity type semiconductor layer of the first light emitting device 10*a* through the connection layer 129*a*, the second bump 133*b* may be electrically connected to the first conductivity type semiconductor layer of the second light emitting device 10*b* through the connection layer 129*b*, and the third bump 133*c* may be electrically connected to the first conductivity type semiconductor layer of the third light emitting device 10*c* through the connection layer 129*c*. The fourth bump 133*d* may be commonly electrically connected to the second conductivity type semiconductor layers of the first, second, and third light emitting devices 10*a*, 10*b*, and 10*c* through the connection layer 129*d*. The bumps 133*a*, 133*b*, 133*c*, and 133*d* may be formed of, for example, metal and/or a metal alloy, such as AuSn, SnAg, Sn, CuSn, CuN, CuAg, Sb, Ni, Zn, Mo, Co, solder, or the like.

The protection layer 131 may cover side surfaces of the bumps 133*a*, 133*b*, 133*c*, and 133*d*, and may cover the step adjustment layer 127. In addition, the protection layer 131 may cover the adhesive layer 125 exposed around the step adjustment layer 127. The protection layer 131 may be formed of, for example, a photosensitive solder resist (PSR), and, accordingly, the protection layer 131 may be patterned first through photolithography and development processes, and then the bumps 133*a*, 133*b*, 133*c*, and 133*d* may be formed. As such, the protection layer 131 may be formed to have openings exposing the contact layers 129*a*, 129*b*, 129*c*, and 129*d*, and the bumps 133*a*, 133*b*, 133*c*, and 133*d* may be formed in the openings of the protection layer 131. In some exemplary embodiments, the bumps 133*a*, 133*b*, 133*c*, and 133*d* may be omitted.

The protection layer 131 may be formed of a light absorbing material, such as a white reflective material or a black epoxy, to prevent light leakage.

Figure 4A:
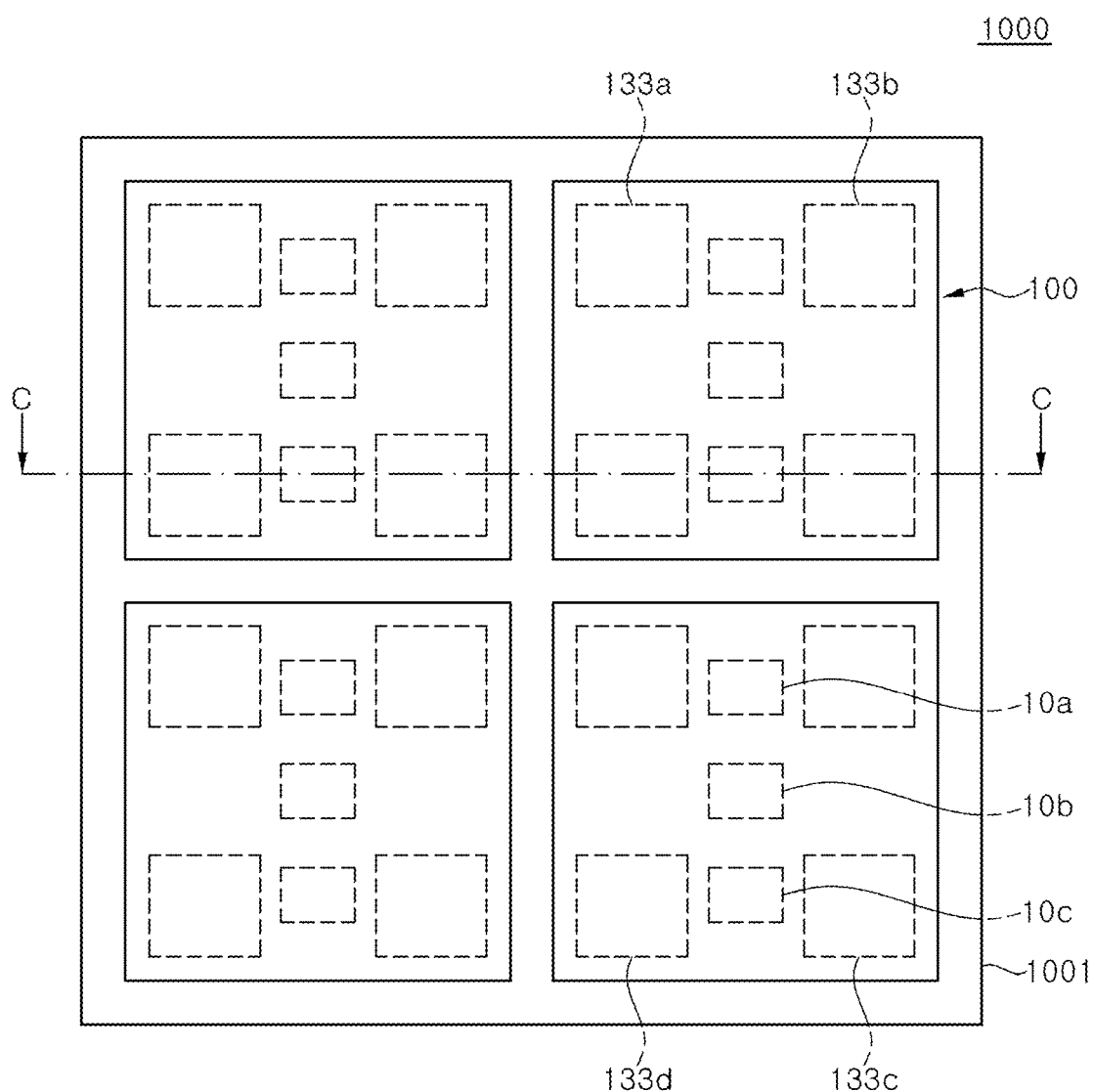
FIG. 4A is a schematic plan view illustrating a pixel module according to an exemplary embodiment.
Figure 4B:
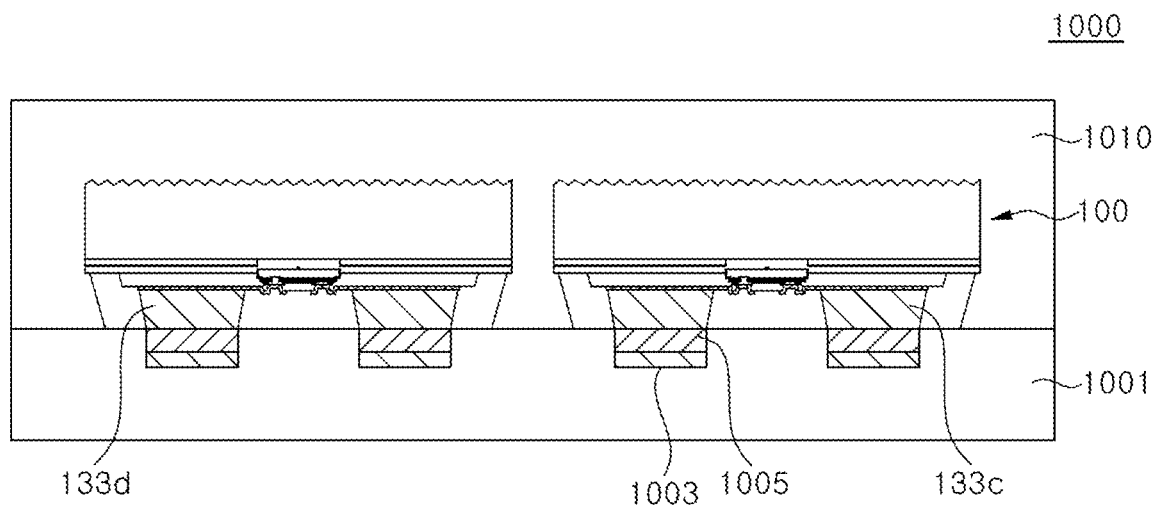
FIG. 4B is a schematic cross-sectional view taken along line C-C of FIG. 4A.
Figure 4C:
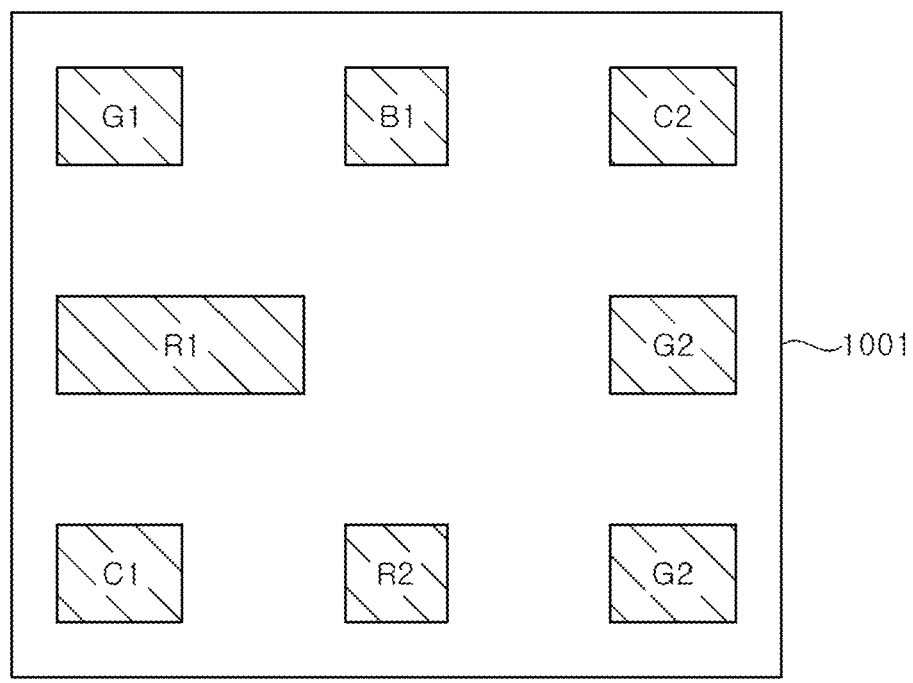
FIG. 4C is a schematic rear view illustrating a pixel module according to an exemplary embodiment.
Figure 4D:
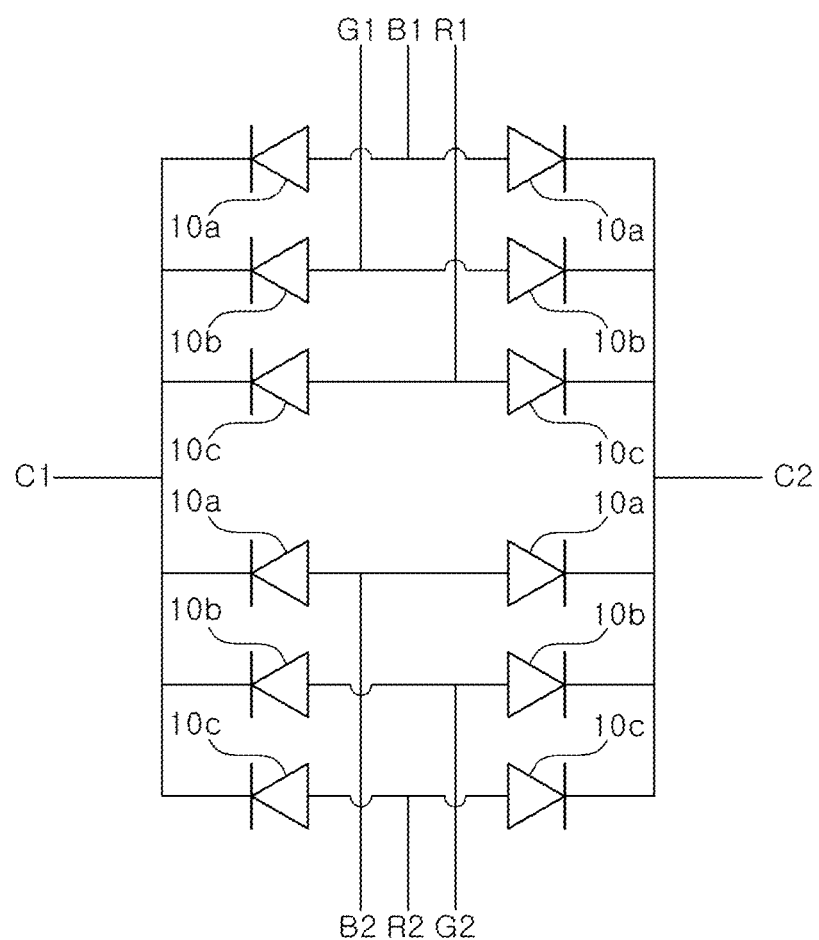
FIG. 4D is a schematic circuit diagram illustrating a pixel module according to an exemplary embodiment.

FIG. 4A is a schematic plan view illustrating a pixel module 1000 according to an exemplary embodiment, FIG. 4B is a schematic cross-sectional view taken along line C-C of FIG. 4A, FIG. 4C is a rear view of the pixel module 1000, and FIG. 4D is a circuit diagram of the pixel module 1000.

Referring to FIGS. 4A and 4B, the pixel module 1000 includes a circuit board 1001 and unit pixels 100 arranged on the circuit board 1001. The pixel module 1000 may further include a cover layer 1010 covering the unit pixels 100.

The circuit board 1001 may have a circuit for electrically connecting a panel substrate 2100 (see FIG. 1) and light emitting devices 10*a*, 10*b*, and 10*c*. The circuit in the circuit board 1001 may be formed to have a multilayer structure. The circuit board 1001 may also include a passive circuit for driving the light emitting devices 10*a*, 10*b*, and 10*c* in a passive matrix driving manner, or an active circuit for driving the light emitting devices 10*a*, 10*b*, and 10*c* in an active matrix driving manner. The circuit board 1001 may include pads 1003 exposed on a surface thereof. The pads 1003 may be arranged to correspond to the bumps in the unit pixels 100 to be mounted thereon.

Since the configuration of the unit pixels 100 is substantially the same as that described with reference to FIGS. 3A and 3B, repeated descriptions thereof will be omitted to avoid redundancy. The unit pixels 100 may be arranged on the circuit board 1001. The unit pixels 100 may be arranged in a 2×2 matrix as shown in FIG. 4A, but the inventive concepts are not limited thereto. For example, in some exemplary embodiments, the unit pixels 100 may be arranged in various matrices, such as 2×3, 3×3, 4×4, 5×5, or the like.

The unit pixels 100 are bonded to the circuit board 1001 by a bonding material 1005. For example, the bonding material 1005 may bond the bumps 133a, 133b, 133c, and 133d to the pads 1003. When the bumps 133a, 133b, 133c, and 133d are formed of solder, the bonding material 1005 may be omitted.

The cover layer 1010 covers a plurality of unit pixels 100. The cover layer 1010 may improve the contrast of the displaying apparatus by preventing optical interference between the unit pixels 100.

The cover layer 1010 may be formed of, for example, a dry-film type solder resist (DFSR), a photoimageable solder resist (PSR), a black material (BM), an epoxy molding compound (EMC), or the like. The cover layer 1010 may be formed using a technique, such as lamination, spin coating, slit coating, printing, or the like, without being limited thereto.

A displaying apparatus 10000 may be provided by mounting the pixel modules 1000 on the panel substrate 2100 of FIG. 1 as shown in FIG. 4A and FIG. 4B. The circuit board 1001 has bottom pads connected to the pads 1003. The bottom pads may be arranged in a one-to-one correspondence with the pads 1003, but the number of the bottom pads may be reduced through a common connection. The pixel module 1000 having the unit pixels 100 arranged in a 2×2 matrix will be described with reference to FIG. 4C and FIG. 4D according to an exemplary embodiment.

FIG. 4C illustrates a rear view of the pixel module 1000, and bottom pads C1, C2, R1, R2, G1, G2, B1, and B2 of the circuit board 1001 are illustrated. Since the pixel modules 1000 are arranged in a 2×2 matrix, a total of four pixel modules are arranged on the circuit board 1001. Three light emitting devices 10a, 10b, and 10c and four bumps 133a, 133b, 133c, and 133d are disposed on each pixel module 1000. Accordingly, sixteen pads 1003 corresponding to the bumps of the four unit pixels 100 may be provided on the circuit board 1001. However, according to an exemplary embodiment, only eight bottom pads may be disposed, and the eight bottom pads may be connected to the panel substrate 2100 to individually drive each of the light emitting devices 10a, 10b, and 10c.

FIG. 4D illustrates a schematic circuit diagram in which each of the light emitting devices 10a, 10b, and 10c are connected to the bottom pads C1, C2, R1, R2, G1, G2, G2, B1, and B2.

Referring to FIG. 4D, the bottom pad C1 is commonly connected to cathodes of the light emitting devices 10a, 10b, and 10c disposed in the left column, and the bottom pad C2 is commonly connected to cathodes of the light emitting devices 10a, 10b, and 10c disposed in the right column.

In the unit pixels 100 arranged in the upper row, the bottom pad B1 may be connected to anodes of the first light emitting devices 10a, the bottom pad G1 may be connected to anodes of the second light emitting devices 10b, and the bottom pad R1 may be connected to anodes of the third light emitting devices 10c.

In the unit pixels 100 arranged in the lower row, the bottom pad B2 may be connected to the anodes of the first light emitting devices 10a, the bottom pad G2 may be connected to the anodes of the second light emitting devices 10b, and the bottom pad R2 may be connected to the anodes of the third light emitting devices 10c.

As used herein, the bottom pads R1, G1, B1, R2, G2, and B2 represent pads connected to red, green, and blue light emitting devices, respectively. However, the order of arrangement of the red, green, and blue light emitting devices may be changed, and, accordingly, locations to which the bottom pads R1, G1, B1, R2, G2, and B2 are connected may also be changed. For example, the circuit diagram of FIG. 4D shows the bottom pads when the first light emitting devices 10a are blue light emitting devices, the second light emitting devices 10b are green light emitting devices, and the third light emitting devices 10c are red light emitting devices. Alternatively, the first light emitting devices 10a may be the blue light emitting devices, and the third light emitting devices 10c may be the red light emitting devices, and, in this case, the locations of the bottom pads R1 and R2 and the bottom pads B1 and B2 may be interchanged.

According to the illustrated exemplary embodiment, since the bottom pads C1 and C2 are commonly connected to the cathodes of the light emitting devices in each column, and each of the bottom pads R1, G1, B1, R2, B2, and G2 are connected to the anodes of the two light emitting devices, and thus, each of the light emitting devices 10a, 10b, and 10c may be driven independently while reducing the total number of the bottom pads.

Figure 4E:
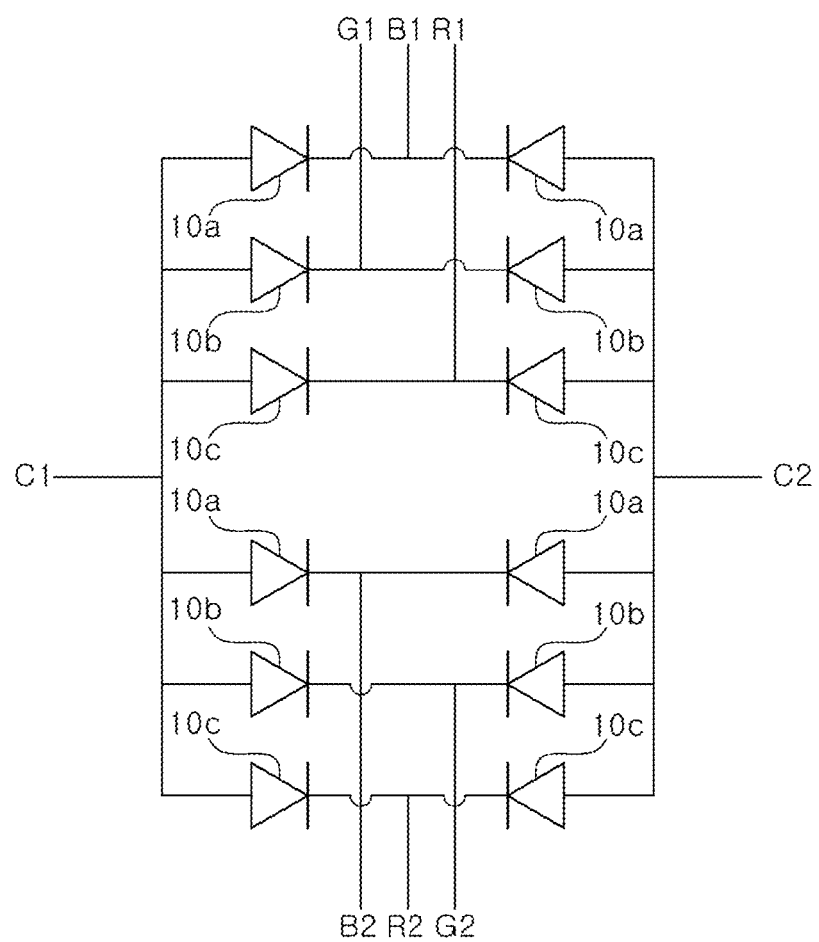
FIG. 4E is a schematic circuit diagram illustrating a pixel module according to another exemplary embodiment.

Although it is described and illustrated that the bottom pads C1 and C2 are connected to the cathodes of the light emitting devices, and the bottom pads R1, G1, B1, R2, B2 and G2 are connected to the anodes of the light emitting device in the illustrated exemplary embodiment, the inventive concepts are not limited thereto. For example, in some exemplary embodiments, the bottom pads C1 and C2 may be connected to the anodes of the light emitting devices, and the bottom pads R1, G1, B1, R2, B2 and G2 may be connected to the cathodes of the light emitting device, as shown in FIG. 4E.

Although the electrical connection of the pixel module 1000 has been described with reference to the unit pixels 100 arranged in a 2×2 matrix, the number of the bottom pads may be reduced using a common connection circuit even when the unit pixels 100 are arranged in another matrix, such as 3×3, 5×5, or the like.

The light emitting devices 10a, 10b, and 10c in the pixel module 1000 may be individually driven by a driving IC disposed on the panel substrate 2100, and images may be implemented by a plurality of pixel modules 1000.

Figure 5A:
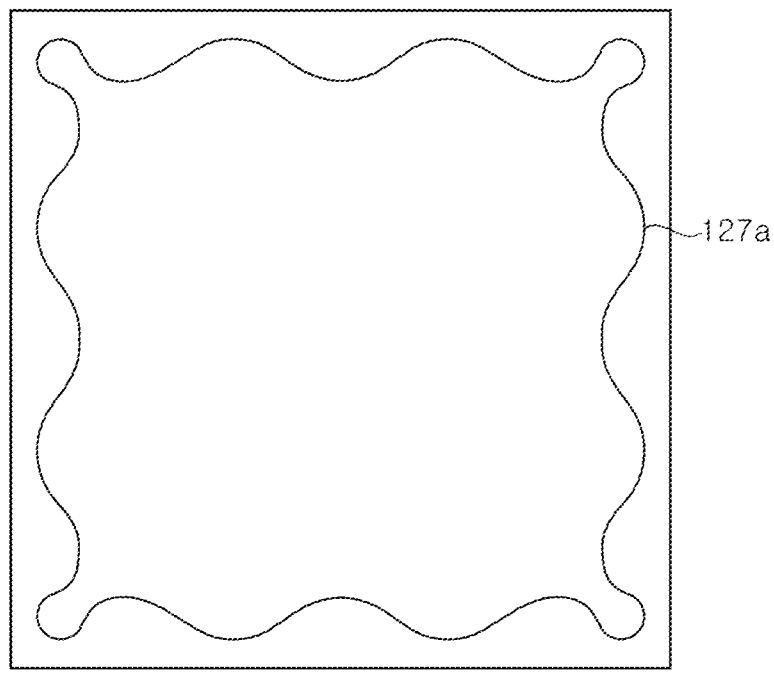
FIG. 5A, FIG. 5B, and FIG. 5C are schematic plan views illustrating a unit pixel according to exemplary embodiments.
Figure 5B:
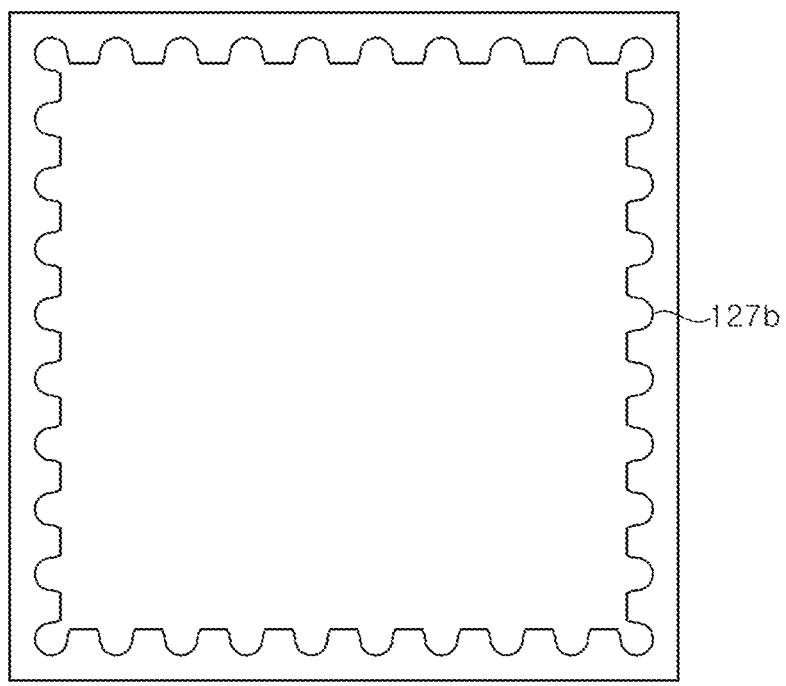
Figure 5C:
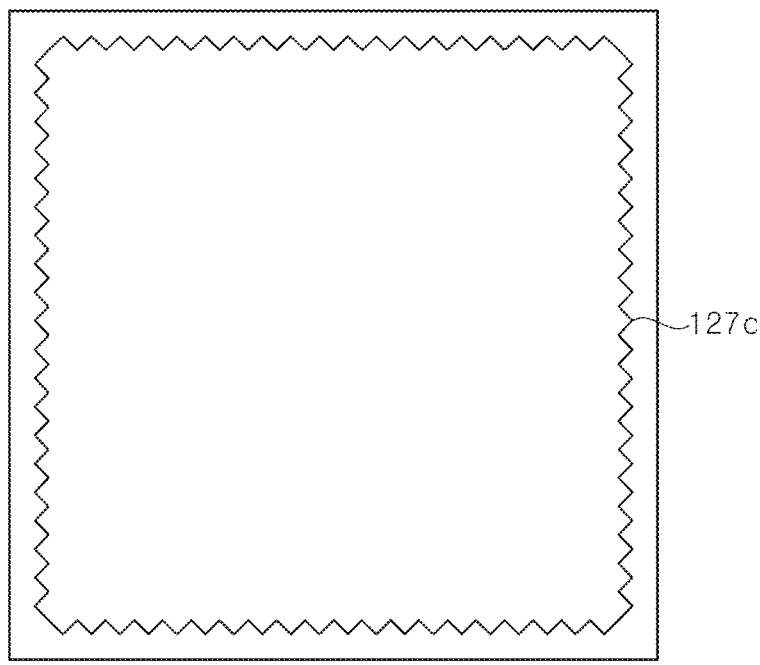

FIG. 5A, FIG. 5B, and FIG. 5C are schematic plan views illustrating a unit pixel according to exemplary embodiments. In particular, FIG. 5A, FIG. 5B, and FIG. 5C illustrate various modified examples of a concave-convex pattern of a step adjustment layer 127.

The step adjustment layer 127a may have a relatively wider concave-convex pattern than those described above as shown in FIG. 5A. In particular, relatively narrow and slender portions may be disposed at corners of the step adjustment layer 127a, thereby preventing concentration of stress at the corners of the step adjustment layer 127a.

More particularly, a concave portion and a convex portion of a step adjustment layer 127a may have an arc shape having a constant radius, and radiuses of the concave portion and the convex portion may be substantially the same or be different from each other.

A bottom of a concave portion of a step adjustment layer 127b may be substantially flat as shown in FIG. 5B. A concave-convex pattern of a step adjustment layer 127c may have a serrated shape as shown in FIG. 5C.

The concave-convex pattern of the step adjustment layer 127 may be variously modified, and, in particular, the step adjustment layer 127 may be formed to prevent stress from concentrating on the corners while the step adjustment layer 127 contracts.

The light emitting device 10 described with reference to FIG. 2A and FIG. 2B has the connection tip 55*b* on a side surface, which is opposite to the surface of the light emitting structure on which the first and second electrode pads 31 and 33 are disposed. In some exemplary embodiments, a connection tip 55*b* may be disposed on the same side surface of the surface on which the first and second electrode pads 31 and 33 are disposed. A location at which the connection tip 55*b* is formed is related to a method of transferring the light emitting devices 10, which will be described in more detail later.

FIGS. 6A through 6K are schematic cross-sectional views illustrating a method of transferring light emitting devices according to an exemplary embodiment.

Figure 6A:
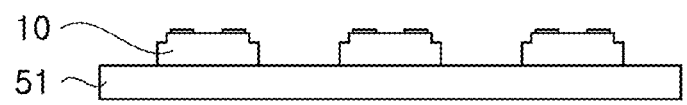
FIGS. 6A, 6B, 6C, 6D, 6E, 6F, 6G, 6H, 6I, 6J, and 6K are schematic cross-sectional views illustrating a method of transferring light emitting devices according to an exemplary embodiment.

Referring to FIG. 6A, light emitting devices 10 are formed on a substrate 51. The substrate 51 may be a substrate capable of growing semiconductor layers of the light emitting devices 10 thereon. The substrate 51 may be, for example, a sapphire substrate or a GaN substrate for growing an AlInGaN-based semiconductor layer, or a GaAs substrate for growing AlNGaP-based semiconductor layers. For example, when the light emitting device 10 is a blue light emitting device or a green light emitting device, the sapphire substrate or the GaN substrate may be used, and, when the light emitting device 10 is a red light emitting device, the GaAs substrate may be used.

Figure 6B:
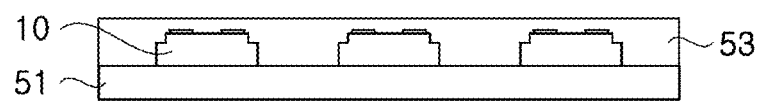

Referring to FIG. 6B, a first mask layer 53 is formed on the substrate 51 to cover the light emitting devices 10. The first mask layer 53 may be formed to completely cover the light emitting devices 10, and may formed over the light emitting devices 10 to have a predetermined thickness.

Figure 6C:
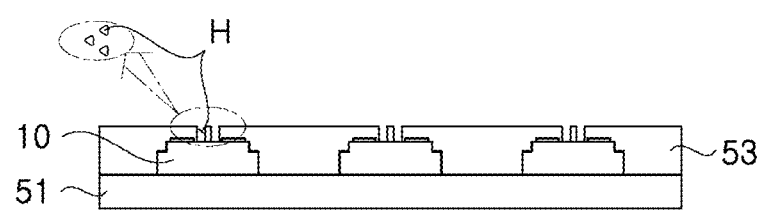

Referring to FIG. 6C, a plurality of holes Hs are formed in the first mask layer 53. Each of the plurality of holes Hs may be formed over the plurality of light emitting devices 10, and at least one hole H may be formed on each of the light emitting devices 10. In the illustrated exemplary embodiment, three holes Hs are formed on each light emitting device 10, and the three holes Hs are arranged asymmetrically to at least one direction where the light emitting devices 10 are arranged. Here, the three holes Hs in the drawing are arranged asymmetrically to a direction, which is perpendicular to the direction where the light emitting devices 10 are arranged.

The first mask layer 53 may be formed of a photosensitive material, and the plurality of holes Hs may be formed through a photolithography process. The plurality of holes Hs may be formed through an exposure and development processes, or through an etching process. The plurality of holes Hs may be formed to have substantially a triangular shape as shown in the drawing. However, the number of holes Hs formed in each light emitting device is not limited to three.

Figure 6D:
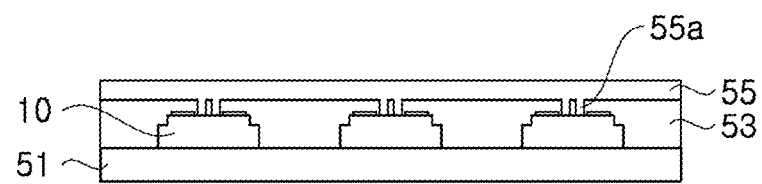

Referring to FIG. 6D, a connection layer 55 is formed on the first mask layer 53. The connection layer 55 is formed on the first mask layer 53 while filling the plurality of holes Hs formed in the first mask layer 53. Since at least one hole H is formed over each light emitting device 10, the connection layer 55 may be connected to the light emitting device 10 through at least one hole H formed over the light emitting device 10. A connection portion 55*a* connected to the light emitting device 10 by filling the hole H may be formed together while the connection layer 55 is formed.

The connection layer 55 may be formed of an organic material, such as poly dimethylpolysiloxane (PDMS), epoxy, acryl, color polyimide, or the like, but it is not limited thereto. The connection layer 55 may have a light transmittance of 90% or more, and a refractive index of about 1.4 to about 1.7.

Figure 6E:
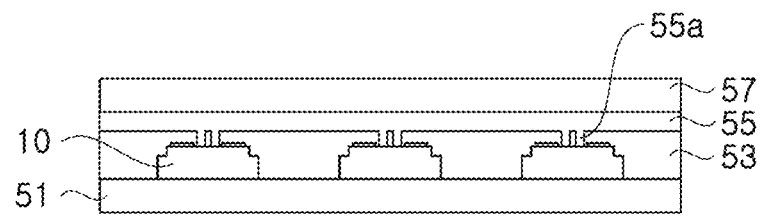

Referring to FIG. 6E, a first temporary substrate 57 is coupled to an upper surface of the connection layer 55. The first temporary substrate 57 may be a polymer substrate, such as PET, PEN, PI sheet, or the like, or may be a substrate, such as glass, PC, PMMA, or the like. When the first temporary substrate 57 is coupled to the upper surface of the connection layer 55, bubbles generated in the connection layer 55 in a vacuum state may be removed, and a hardening process of the connection layer 55 may be performed at a temperature lower than a melting point of the first mask layer 53. In this manner, the first temporary substrate 57 may be coupled to the connection layer 55.

Figure 6F:
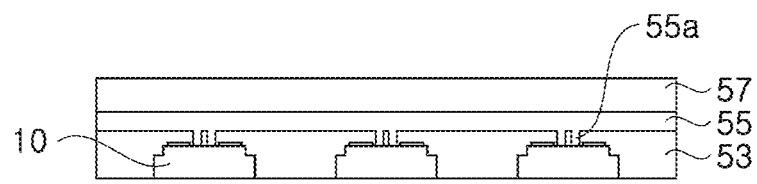

When the first temporary substrate 57 is coupled to the connection layer 55, the substrate 51 is removed from the light emitting devices 10 as shown in FIG. 6F. The substrate 51 may be removed by a laser lift-off process or a wet etching process. For example, if the substrate 51 is a sapphire substrate, the substrate 51 may be removed by the laser lift-off process or a chemical lift-off process, and if the substrate 51 is a GaAs substrate, the GaAs substrate may be removed by the wet etching process.

Figure 6G:
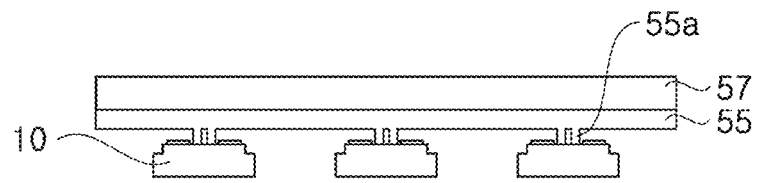

Referring to FIG. 6G, in a state where the substrate 51 is removed, the first mask layer 53 is removed from the light emitting devices 10. The first mask layer 53 may be removed using, for example, acetone, a dedicated striper, etching, or the like. As the first mask layer 53 is removed, each of the light emitting devices 10 is connected to the connection layer 55 through the at least one connection portion 55*a* and maintained as shown in the drawing.

Figure 6H:
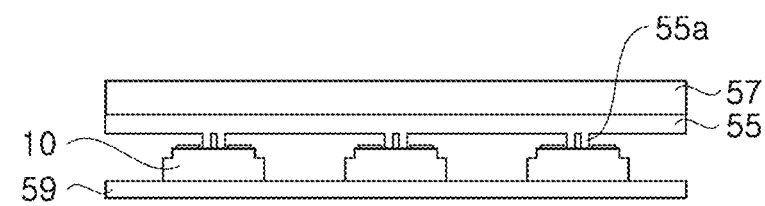

Referring to FIG. 6H, after the first mask layer 53 is removed from the light emitting devices 10, a second temporary substrate 59 is coupled to lower surfaces of the light emitting devices 10. The second temporary substrate 59 may be a rubber or UV sheet, or may be a polymer substrate, such as PET, PEN, PI sheet, or the like, or a substrate, such as glass, PC, PMMA, or the like.

Figure 6I:
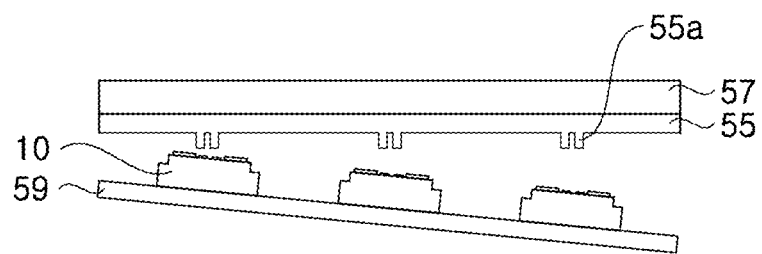

When coupling the second temporary substrate 59 to the light emitting devices 10 is completed, the light emitting devices 10 are removed from the connection layer 55 using the second temporary substrate 59 as shown in FIG. 6I. By applying an external force to the second temporary substrate 59 coupled to the light emitting devices 10 in a direction away from the first temporary substrate 57, e.g., downward, the at least one connection portion 55*a* connected to the light emitting devices 10 may be cut, and the light emitting devices 10 are separated from the connection layer 55.

The external force applied to the second temporary substrate 59 as shown in the drawing may be applied in a direction perpendicular to the connection layer 55 at one side of the second temporary substrate 59. As such, each of the light emitting devices 10 may be separated from the connection layer 55 such that the at least one connection portion 55*a* connected to each light emitting device 10 is sequentially cut from one side of the second temporary substrate 59.

Figure 6J:
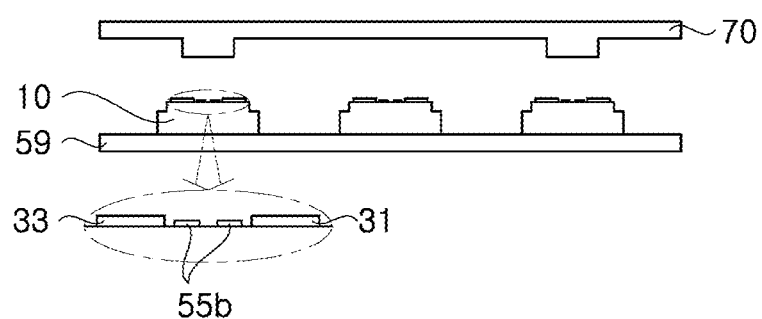

Referring to FIG. 6J, the light emitting devices 10 separated from the connection layer 55 are disposed on the second temporary substrate 59 with a predetermined interval. In this case, at least one connection tip 55*b* may be formed on each of the light emitting devices 10 as a residue while the connection portion 55*a* is cut. Accordingly, the connection tip 55*b* is formed of the same material as the connection layer 55. Since the connection portion 55*a* is cut by an external force, the thicknesses of the connection tips 55b may be irregular and be different from one another.

Figure 6K:
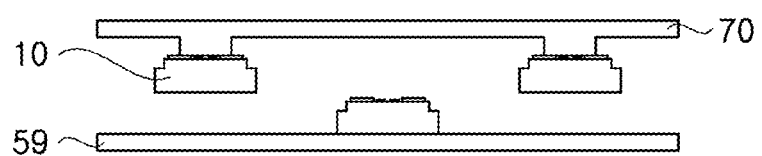

Referring to FIG. 6J and FIG. 6K, a portion of the light emitting devices 10 disposed on the second temporary substrate 59 is transferred to another substrate using a pickup 70. The pickup 70 may include an elastomeric stamp, for example.

The pickup 70 picks up and transfers a portion of the plurality of light emitting devices 10. More particularly, the pickup 70 selectively picks up the light emitting devices 10 in accordance with an interval between light emitting devices 10, which will be arranged on the transparent substrate 121. As such, as shown in the drawing, the pickup 70 picks up only some of the light emitting devices 10 having a certain interval at a time. The interval between the light emitting devices 10 picked up may vary depending on an interval between pixels in the transparent substrate 121 onto which the light emitting devices 10 are to be transferred.

After the light emitting devices 10 are arranged on the transparent substrate 121 to correspond to a plurality of unit pixels 100, the transparent substrate 121 may be cut in each pixel unit to form the unit pixel 100. As such, the light emitting devices 10 are transferred onto the transparent substrate 121 to correspond to each unit pixel 100.

The pickup 70 picks up the light emitting devices 10 that are spaced apart at an interval that matches an interval between the unit pixels 100, and one of the first light emitting device 10a, the second light emitting device 10b, and the third light emitting device 10c may be picked up to be arranged in a single unit pixel 100.

According to an exemplary embodiment, the light emitting devices 10 may be picked up in a state where the first and second electrode pads 31 and 33 are disposed thereon, and may be also transferred to the transparent substrate 121 in this state. As such, light generated in the light emitting structure may be emitted to the outside through the transparent substrate 121. In another exemplary embodiment, the light emitting devices 10 may be mounted on a circuit board, and, in this case, the first and second electrode pads 31 and 33 may be mounted toward the circuit board. In this case, an additional temporary substrate may be used in the process of mounting the light emitting devices 10 on the circuit board using the pickup 70. More particularly, the light emitting devices 10 picked up through the pickup 70 may be first arranged on the additional temporary substrate at the interval between the unit pixels 100. Thereafter, the light emitting devices 10 disposed on the additional temporary substrate may be transferred to the circuit board at a time. As such, the light emitting devices 10 may be transferred, so that the first and second electrode pads 31 and 33 may be bonded to the circuit board.

FIGS. 7A through 7L are schematic cross-sectional views illustrating a method of transferring light emitting devices according to another exemplary embodiment.

Figure 7A:
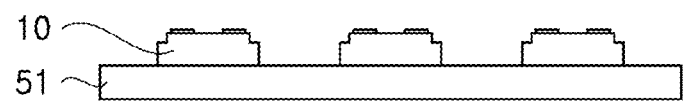
FIGS. 7A, 7B, 7C, 7D, 7E, 7F, 7G, 7H, 7I, 7J, 7K, and 7L are schematic cross-sectional views illustrating a method of transferring light emitting devices according to another exemplary embodiment.

Referring to FIG. 7A, light emitting devices 10 are grown on a substrate 51. The substrate 51 may be a substrate capable of growing semiconductor layers of the light emitting device 10 thereon. When the light emitting device 10 is a blue light emitting device or a green light emitting device, a sapphire substrate or a GaN substrate may be used, and, when the light emitting device 10 is a red light emitting device, a GaAs substrate may be used.

Figure 7B:
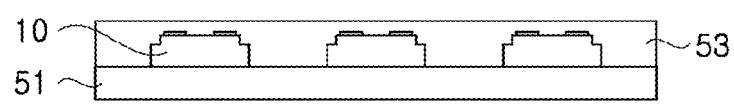

Referring to FIG. 7B, a first mask layer 53 is formed on the substrate 51 to cover the light emitting devices 10. The first mask layer 53 may be formed to cover each of the light emitting devices 10, and may be formed to have a predetermined thickness on an upper surfaces of the light emitting devices 10.

Figure 7C:
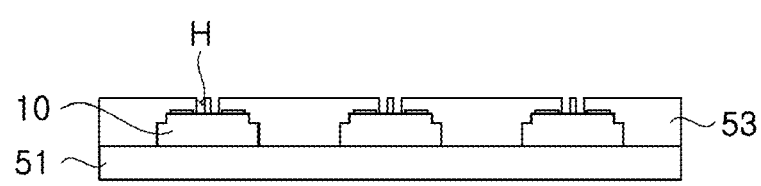

Subsequently, referring to FIG. 7C, a plurality of holes Hs are formed in the first mask layer 53. At least one hole H may be formed on each of the light emitting devices 10. According to the illustrated exemplary embodiment, three holes Hs may be formed on each light emitting device 10, and the three holes Hs are arranged asymmetrically to at least one direction where the light emitting devices 10 are arranged. The three holes Hs in the drawing are arranged asymmetrically to a direction, which is perpendicular to the direction where the light emitting devices 10 are arranged.

The first mask layer 53 may be formed of a photosensitive material, and the plurality of holes Hs may be formed through a photolithography process. For example, the holes Hs may be formed through an exposure and development processes or an etching process may be used. The plurality of holes Hs may be formed in substantially a triangular shape as shown in the drawing.

Figure 7D:
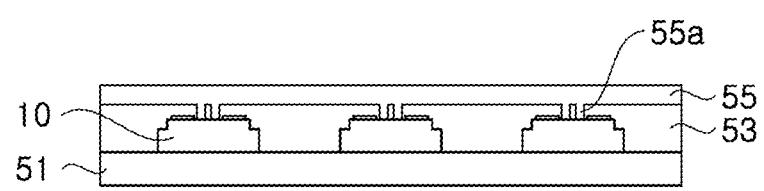

Referring to FIG. 7D, a connection layer 55 is formed on the first mask layer 53. The connection layer 55 is formed on the first mask layer 53 while filling the plurality of holes Hs formed in the first mask layer 53. Since each of the plurality of holes Hs is formed over the light emitting device 10, the connection layer 55 may be connected to the light emitting devices through at least one hole H formed over the light emitting device 10. A portion of the connection layer 55 may form a connection portion 55a by filling the at least one hole H formed over the light emitting device 10.

The connection layer 55 may be formed of an organic material, such as poly dimethylpolysiloxane (PDMS), epoxy, acryl, color polyimide, or the like, but it is not limited thereto. The connection layer 55 may have a light transmittance of 90% or more, and a refractive index of about 1.4 to about 1.7.

Figure 7E:
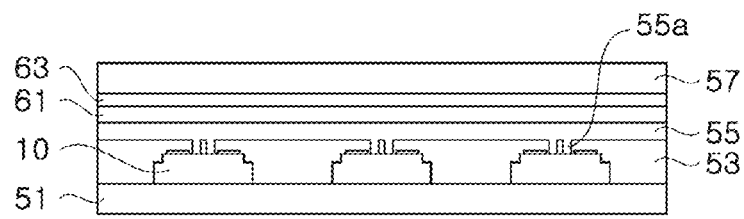

Referring to FIG. 7E, a first temporary substrate 57 is coupled to an upper surface of the connection layer 55. The first temporary substrate 57 may be a polymer substrate, such as PET, PEN, PI sheet, or the like, or may be a substrate, such as glass, PC, PMMA, or the like. A film layer 61 and a buffer layer 63 may be disposed between the first temporary substrate 57 and the connection layer 55, respectively. For example, the film layer 61 may be disposed over the connection layer 55, the buffer layer 63 may be disposed over the film layer 61, and the first temporary substrate 57 may be disposed over the buffer layer 63. The buffer layer 63 may be formed of a material that may be melt by heat or UV irradiation.

When the first temporary substrate 57 is coupled to the upper surface of the connection layer 55, bubbles generated in the connection layer 55 in a vacuum state may be removed, and a hardening process of the connection layer 55 may be performed at a temperature lower than a melting point of the first mask layer 53. In this manner, the first temporary substrate 57 may be coupled to the connection layer 55.

Figure 7F:
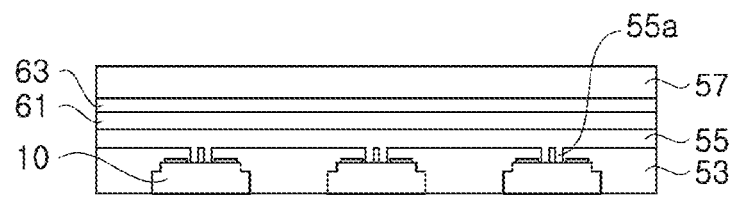

Referring to FIG. 7F, the substrate 51 is removed from the light emitting devices 10. The substrate 51 may be removed by a laser lift-off process or a wet etching process. For example, when the substrate 51 is a sapphire substrate, it may be removed by the laser lift-off process or a chemical lift-off process, and when the substrate 51 is a GaAs substrate, it may be removed by the wet etching process.

Figure 7G:
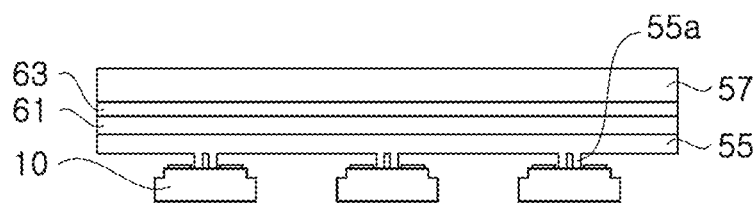

Referring to FIG. 7G, the first mask layer 53 is removed from the light emitting devices 10 in a state that the substrate 51 is removed. The first mask layer 53 may be removed using, for example, acetone, a dedicated striper, dry etching, or the like. As such, the light emitting devices 10 are connected to the connection layer 55 through at least one connection portion 55a connected to each light emitting device 10 and maintained as shown in the drawing.

Figure 7H:
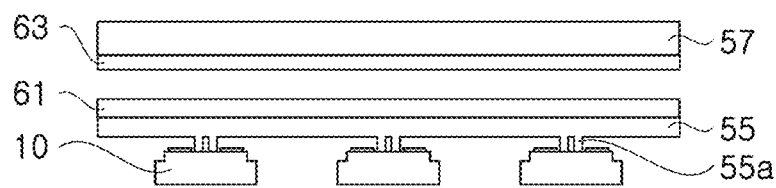

Referring to FIG. 7H, the first temporary substrate 57 coupled to the upper surface of the connection layer 55 is removed. The first temporary substrate 57 may be removed by heat or UV irradiation. In this manner, the first temporary substrate 57 may be removed without damaging the film layer 61 because the buffer layer 63 is formed of a material that may be melt by heat or UV irradiation.

Figure 7I:
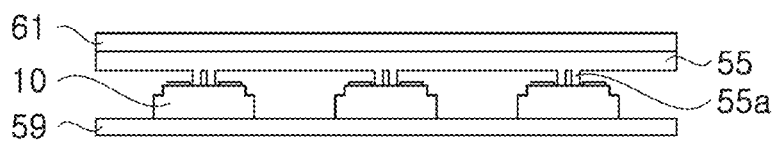

Referring to FIG. 7I, a second temporary substrate 59 is coupled to a lower surface of the light emitting devices 10. The second temporary substrate 59 may be a rubber or UV sheet, or may be a polymer substrate, such as PET, PEN, PI sheet, or the like, or a substrate, such as glass, PC, PMMA, or the like.

Figure 7J:
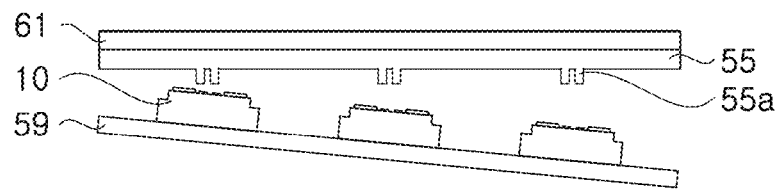

When the second temporary substrate 59 is coupled to the light emitting devices 10, the light emitting devices 10 are removed from the connection layer 55 using the second temporary substrate 59 as shown in FIG. 7J. By applying an external force downward to the second temporary substrate 59 coupled to the light emitting devices 10, the at least one connection portion 55a connected to the light emitting devices 10 is cut, and the light emitting devices 10 are separated from the connection layer 55.

The external force applied to the second temporary substrate 59 may be applied in a direction perpendicular to the connection layer 55 at one side of the second temporary substrate 59. As such, each of the light emitting devices 10 may be separated from the connection layer 55, such that the connection portions 55a connected to each light emitting device 10 are sequentially cut.

Figure 7K:
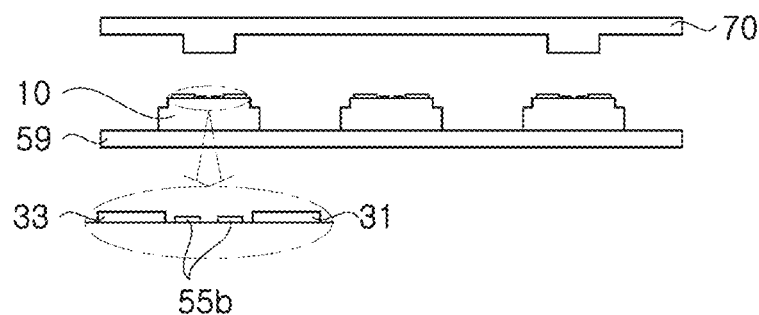

Referring to FIG. 7K, the light emitting devices 10 separated from the connection layer 55 are disposed on the second temporary substrate 59 at a predetermined interval. At least one connection tip 55b may be formed on each of the light emitting devices 10 as a residue while the connection portion 55a is cut. As such, the connection tip 55b is formed of the same material as the connection layer 55. Since the connection tip 55b is formed while the connection portion 55a is cut by an external force, the thicknesses of the connection tips 55b may be different from one another. Also, the thicknesses of the connection tips 55b may be less than those of the first and second electrode pads 31 and 33 as shown in the drawing.

Figure 7L:
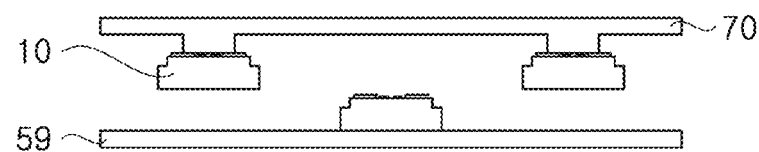

Referring to FIGS. 7K and 7L, some of the light emitting devices 10 disposed on the second temporary substrate 59 are transferred to another substrate using a pickup 70. A substrate to be transferred may be a transparent substrate 121, but is not limited thereto. After the light emitting devices 10 are transferred to the transparent substrate 121 in a unit of unit pixels 100, the transparent substrate 121 may be cut in the unit of the unit pixels 100 in some exemplary embodiments.

FIGS. 8A through 8K are schematic cross-sectional views illustrating a method of transferring light emitting devices according to another exemplary embodiment.

Figure 8A:
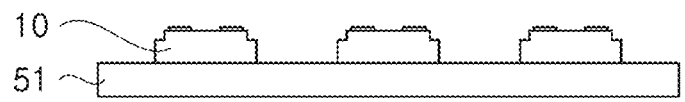
FIGS. 8A, 8B, 8C, 8D, 8E, 8F, 8G, 8H, 8I, 8J, and 8K are schematic cross-sectional views illustrating a method of transferring light emitting devices according to another exemplary embodiment.

Referring to FIG. 8A, light emitting devices 10 are formed on a substrate 51. The substrate 51 is a substrate capable of growing semiconductor layers of the light emitting device thereon, such as a sapphire substrate, a GaN substrate, or a GaAs substrate. For example, the substrate 51 may be the sapphire substrate when the light emitting device 10 is a blue light emitting device or a green light emitting device, and may be a GaAs substrate when the light emitting device 10 is a red light emitting device.

Figure 8B:
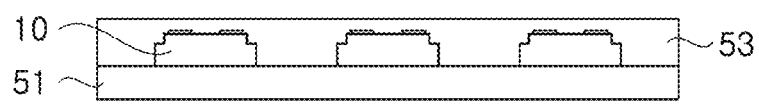

Referring to FIG. 8B, a first mask layer 53 is formed on the substrate 51 to cover the light emitting devices 10. The first mask layer 53 may be formed to cover each of the light emitting devices 10, and may be formed to have a predetermined thickness on an upper surfaces of the light emitting devices 10. The first mask layer 53 may be formed of, for example, a photosensitive material.

Figure 8C:
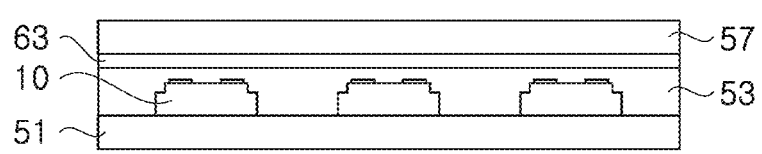

Referring to FIG. 8C, a first temporary substrate 57 is coupled onto the first mask layer 53. The first temporary substrate 57 may be a polymer substrate, such as PET, PEN, PI sheet, or the like, or may be a substrate, such as glass, PC, PMMA, or the like. A buffer layer 63 may be disposed between the first temporary substrate 57 and the first mask layer 53. The buffer layer 63 may be disposed on the first mask layer 53, and the first temporary substrate 57 may be disposed on the buffer layer 63.

Figure 8D:
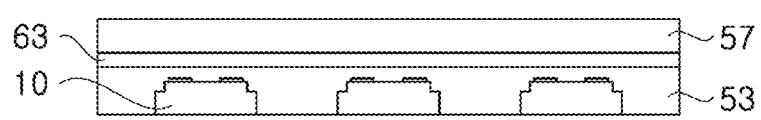

Referring to FIG. 8D, the substrate 51 is removed from the light emitting devices 10. The substrate 51 may be removed using a laser lift-off process, a wet etching process, or the like. When the substrate 51 is a sapphire substrate, the substrate 51 may be removed by the laser lift-off process or a chemical lift-off process. When the substrate 51 is a GaAs substrate, the substrate 51 may be removed by the wet etching process.

Figure 8E:
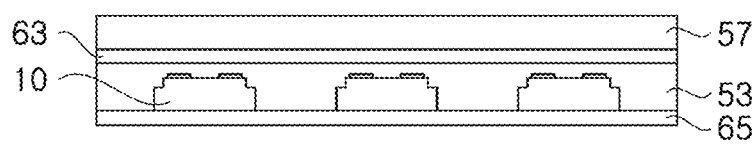

Referring to FIG. 8E, a lower surface of the light emitting devices 10 and a lower surface of the first mask layer 53 may be exposed as the substrate 51 is removed. A second mask layer 65 is formed under the light emitting devices 10 and the first mask layer 53. The second mask layer 65 may cover the lower surface of the light emitting devices 10, and may have a thickness less than that of the first mask layer 53.

Figure 8F:
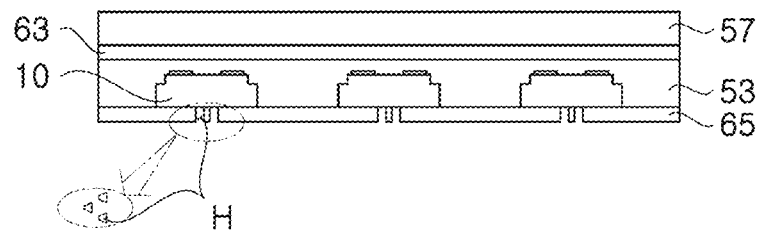

Referring to FIG. 8F, a plurality of holes Hs are formed in the second mask layer 65. At least one hole H may be formed under each light emitting device 10. According to the illustrated exemplary embodiment, three holes Hs may be formed under each light emitting device 10, and the three holes Hs are arranged asymmetrically to at least one direction where the light emitting devices 10 are arranged. The three holes Hs in the drawing are arranged asymmetrically to a direction which is perpendicular to the direction where the light emitting devices 10 are arranged.

The second mask layer 65 may be formed with a photosensitive material as the first mask layer 53, and the plurality of holes Hs may be formed by a photolithography process, for example. The plurality of holes Hs may be formed to have substantially a triangular shape as shown in the drawing.

Figure 8G:
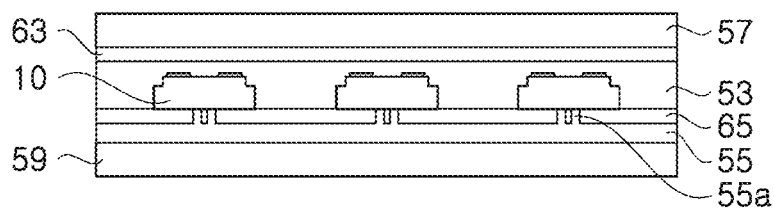

Referring to FIG. 8G, a connection layer 55 is formed under the second mask layer 65. The connection layer 55 is formed under the second mask layer 65 while filling the plurality of holes Hs formed in the second mask layer 65. Since each of the plurality of holes Hs is formed under the light emitting device 10, the connection layer 55 may be connected to the light emitting devices 10 through the holes Hs formed under the light emitting devices 10. Connection portions 55a filling the holes Hs are formed together with the connection layer 55. The connection portions 55a may directly contact the first conductivity type semiconductor layer 23 of the light emitting device 10.

The connection layer 55 may include an organic material, such as poly dimethylpolysiloxane (PDMS), epoxy, acryl, color polyimide, or the like, but it is not limited thereto. The connection layer 55 may have a light transmittance of 90% or more, and a refractive index of about 1.4 to about 1.7.

A second temporary substrate 59 is coupled to a lower surface of the connection layer 55. The second temporary substrate 59 may be a polymer substrate as the first temporary substrate 57, such as PET, PEN, PI sheet, or the like, or may be a substrate such as glass, PC, PMMA, or the like.

Figure 8H:
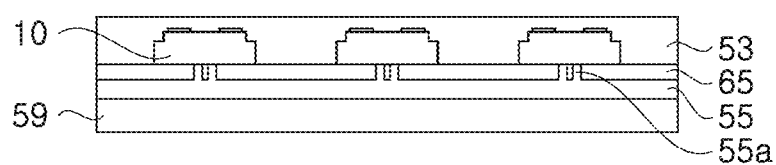

Referring to FIG. 8H, the first temporary substrate 57 coupled to an upper surface of the connection layer 55 is removed. The first temporary substrate 57 may be removed by heat or UV irradiation. The first temporary substrate 57 may be removed from the first mask layer 53 as the buffer layer 63 is formed of a material that may be melt by heat or UV irradiation.

Figure 8I:
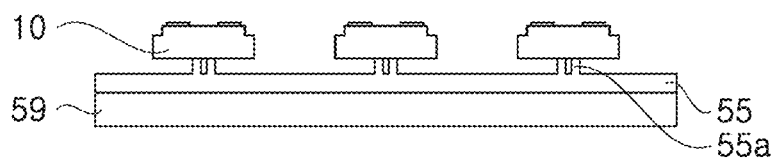

Referring to FIG. 8I, the first mask layer 53 and the second mask layer 65 are removed from the light emitting devices 10. The first mask layer 53 and the second mask layer 65 may be removed using, for example, acetone, a dedicated striper, dry etching, or the like. As shown in the drawing, the light emitting devices 10 are connected to the connection layer 55 by at least one connection portion 55a connected to each light emitting device 10 and maintained.

Figure 8J:
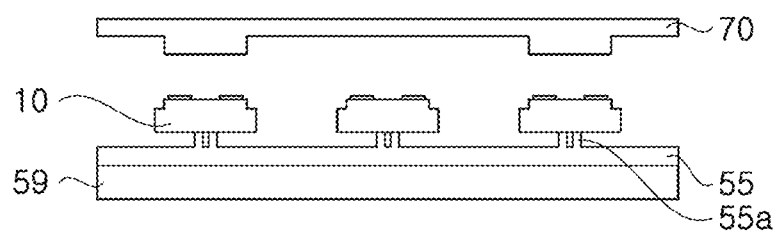

Once the first and second mask layers 53 and 65 are removed, the light emitting devices 10 are disposed over the second temporary substrate 59 while being connected to the connection layer 55 and the connection portion 55a as shown in FIG. 8J. A portion of the light emitting devices 10 disposed over the second temporary substrate 59 may be transferred to another substrate using a pickup 70.

Figure 8K:
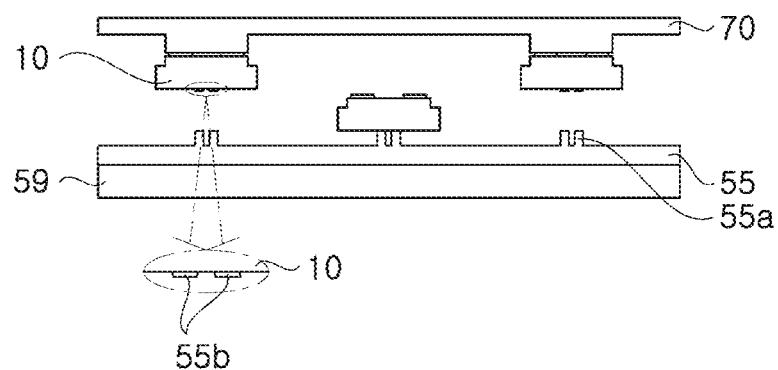

Referring to FIG. 8K, each of the light emitting devices 10 picked up by the pickup 70 is separated from the connection layer 55 as the connection portion 55a is snapped from the connection layer 55. The pickup 70 picks up the light emitting devices 10 over the light emitting devices 10, and a residue of the connection portion 55a is disposed under the light emitting device 10. As such, at least one connection tip 55b may be formed under each of the light emitting devices 10.

Thereafter, the light emitting devices 10 picked up by the pickup 70 may be transferred to the transparent substrate 121, and the transparent substrate 121 may be cut in a unit of individual unit pixel 100 to provide the unit pixels 100.

The light emitting devices 10 are transferred to the transparent substrate 121 by the method of transferring the light emitting device described above. An adhesive layer 125 may be formed on the transparent substrate 121 in advance, and the light emitting devices 10 may be attached onto the transparent substrate 121 by the adhesive layer 125. Thereafter, a step adjustment layer 127 and connection layers 129a, 129b, 129c, and 129d, a protection layer 131, and bumps 133a, 133b, 133c, and 133d are formed, and then the transparent substrate 121 is cut off to manufacture the unit pixel 100 described with reference to FIG. 3A and FIG. 3B. A pixel module 1000 may be manufactured by arranging the unit pixels 100 on a circuit board 1001, and a displaying apparatus 10000 may be provided by arranging the pixel modules 1000 on a panel substrate 2100.

Figure 9A:
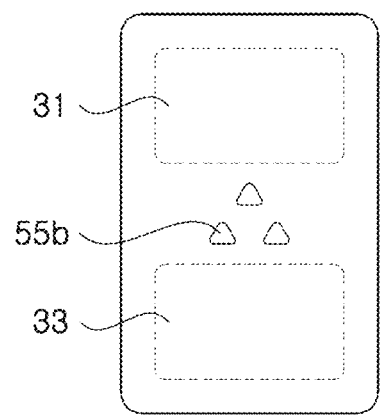
FIGS. 9A, 9B, 9C, 9D, 9E, 9F, 9G, 9H, 9I, 9J, 9K, 9L, 9M, 9N, and 9O are schematic plan views illustrating a light emitting device according to exemplary embodiments.
Figure 9B:
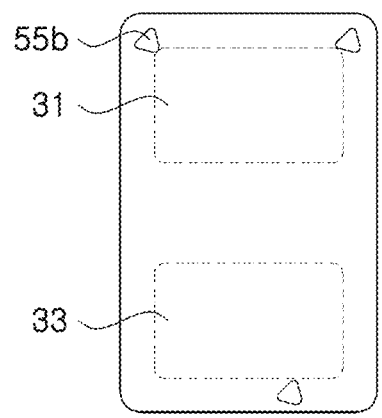
Figure 9C:
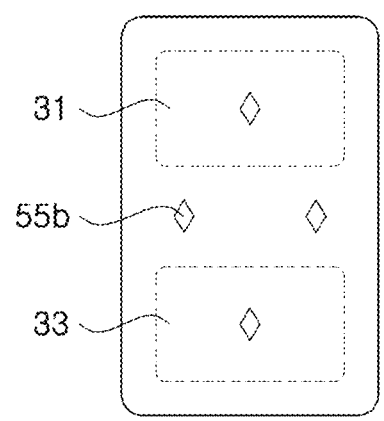
Figure 9D:
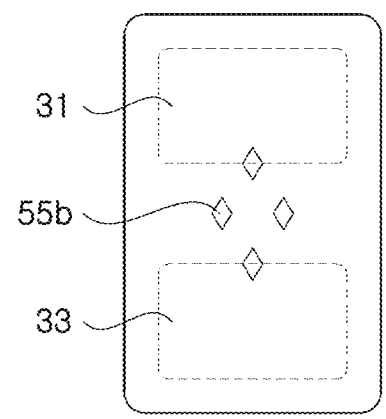
Figure 9E:
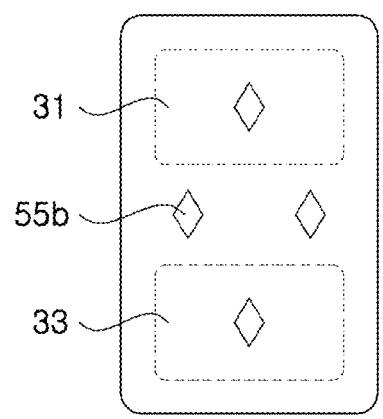
Figure 9F:
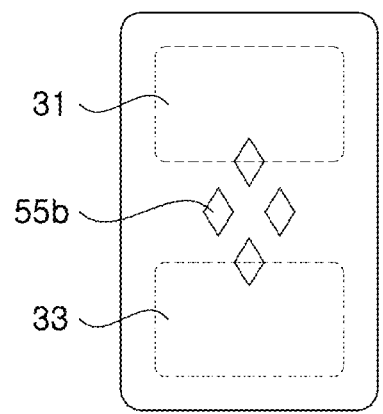
Figure 9G:
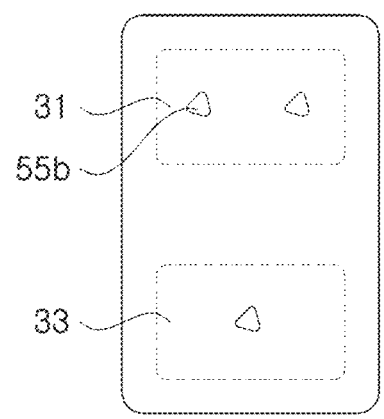
Figure 9H:
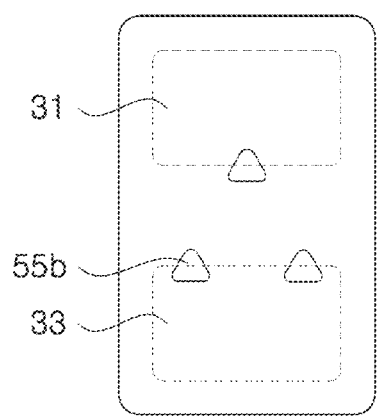
Figure 9I:
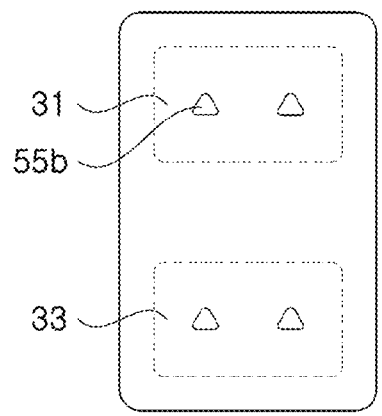
Figure 9J:
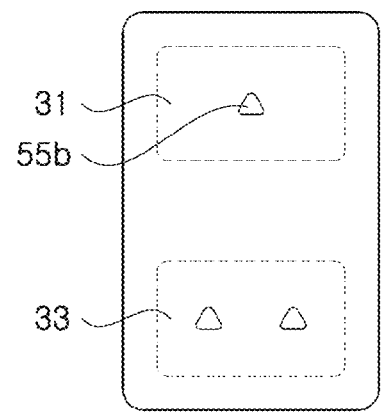
Figure 9K:
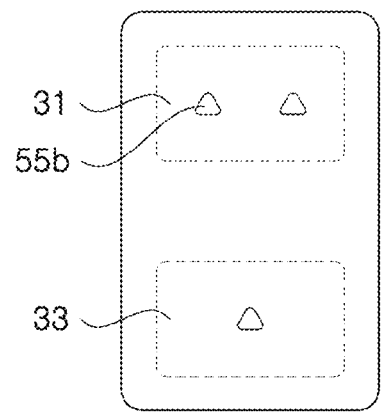
Figure 9L:
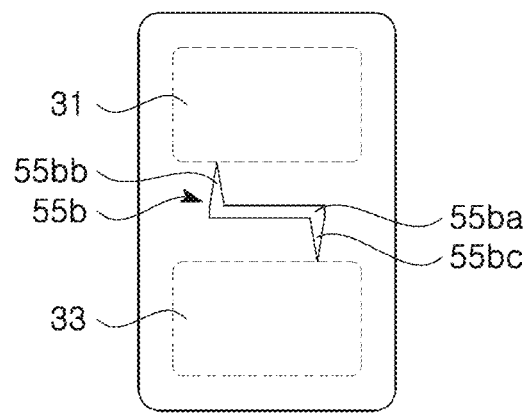
Figure 9M:
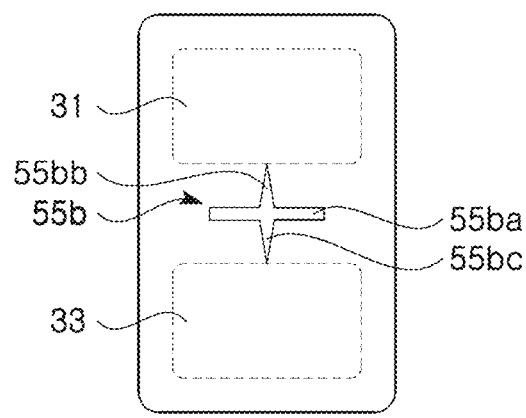
Figure 9N:
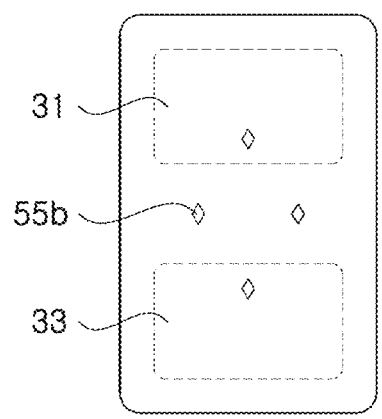
Figure 9O:
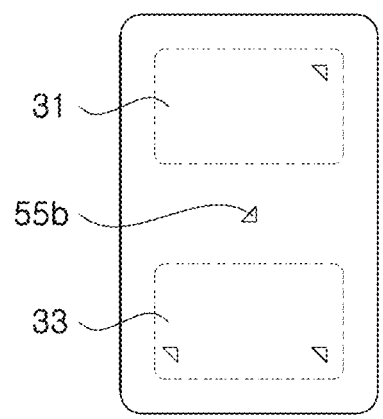

FIGS. 9A through 9O are schematic plan views illustrating a light emitting device 10 according to exemplary embodiments.

In light emitting devices 10 shown in FIGS. 9A through 9O according to exemplary embodiments, a connection tip 55b is disposed on an opposite side to first and second electrode pads 31 and 33. Hereinafter, a location of the connection tip 55b will exemplarily be described with reference to a location relative to those of the first and second electrode pads 31 and 33. However, the connection tip 55b and the first and second electrode pads 31 and 33 are disposed on sides of the light emitting device 10 which are opposite to each other, and they do not contact each other.

Referring to FIG. 9A, in a first modified example, three connection tips 55b are formed in the light emitting device 10, which are disposed between the first and second electrode pads 31 and 33. More particularly, the three connection tips 55b are formed on an upper surface of the light emitting device 10. The first and second electrode pads 31 and 33 are formed under the light emitting device 10. A shape of the three connection tips 55b may be formed in substantially a triangular shape. A total area of the three connection tips 55b may be, for example, about 1.26% as compared with a planar area of the light emitting device 10.

Referring to FIG. 9B, in a second modified example, three connection tips 55b are formed in the light emitting device 10, which are disposed outside of the first and second electrode pads 31 and 33. Two connection tips 55b are disposed near the first electrode pad 31 adjacent to outer corners of the first electrode pad 31, respectively. The remaining connection tip 55b is disposed outside the second electrode pad 33. In this case, the two connection tips 55b disposed on sides of the first electrode pad 31 may be disposed in a direction different from a direction where the first and second electrode pads 31 and 33 are disposed.

A total area of the three connection tips 55b may be, for example, about 0.65% as compared with the planar area of the light emitting device 10.

Referring to FIG. 9C, in a third modified example, four connection tips 55b are formed on the light emitting device 10, which are widely disposed on the plane of the light emitting device 10. More particularly, two of the four connection tips 55b are disposed at a location overlapping with the first and second electrode pads 31 and 33, and the other two are disposed between the first and second electrode pads 31 and 33. In this case, each of the two connection tips 55b disposed at a location overlapping with the first and second electrode pads 31 and 33 may be disposed at centers of the first and second electrode pads 31 and 33.

The connection tips 55b of FIG. 9C may be formed to have substantially a diamond shape, and the four connection tips 55b may be disposed at each corner of the diamond shape. In this case, a total area of the four connection tips 55b may be, for example, about 1.22% as compared with the planar area of the light emitting device 10.

Referring to FIG. 9D, in a fourth modified example, four connection tips 55b are formed in the light emitting device 10. Two of the four connection tips 55b are disposed to partially overlap with the first and second electrode pads 31 and 33, and the other two are disposed between the first and second electrode pads 31 and 33. The connection tips 55b of the fourth modified example may be disposed at a relatively small interval as compared with the connection tips 55b of the third modified example.

Each of the connection tips 55b may be formed to have substantially a diamond shape, and the four connection tips 55b may be disposed at each corner of the diamond shape. In this case, a total area of the four connection tips 55b may be, for example, about 1.22% as compared with the planar area of the light emitting device 10.

Referring to FIG. 9E, in a fifth modified example, four connection tips 55b are formed in the light emitting device 10. The connection tips 55b of the fifth modified example may be disposed in the same manner as the connection tips 55b of the third modified example. In this case, a total area of the connection tips 55b of the fifth modified example may be greater than that of the connection tips 55b of the third modified example, and may be, for example, about 2.71% as compared with the planar area of the light emitting device 10.

Referring to FIG. 9F, in a sixth modified example, four connection tips 55*b* are formed in the light emitting device 10. The connection tips 55*b* of the sixth modified example may be disposed in the same manner as the connection tips 55*b* of the fourth modified example. In this case, a total area of the connection tips 55*b* of the sixth modified example may be greater than that of the connection tips 55*b* of the fourth modified example, and may be, for example, about 2.71% as compared with the planar area of the light emitting device 10.

Referring to FIG. 9G, in a seventh modified example, three connection tips 55*b* are formed in the light emitting device 10, which are disposed at locations overlapping with the first and second electrode pads 31 and 33. More particularly, two connection tips 55*b* are disposed at locations overlapping with the first electrode pads 112, and the remaining connection tip 55*b* is disposed at a location overlapping with the second electrode pad 33. The two connection tips 55*b* overlapping the first electrode pad 31 may be disposed in a direction different from a direction in which the first and second electrode pads are disposed.

A total area of the three connection tips 55*b* may be, for example, about 0.58% as compared with the planar area of the light emitting device 10.

Referring to FIG. 9H, in an eighth modified example, three connection tips 55*b* are formed in the light emitting device 10, which are disposed at locations partially overlapping with the first and second electrode pads 31 and 33. One of the three connection tips 55*b* is disposed at a location partially overlapping with the first electrode pad 31, and the other two connection tips 55*b* are disposed at a location partially overlapping with the second electrode pad 33. In this case, the three connection tips 55*b* may be formed to have substantially a triangular shape, and the three connection tips 55*b* may be disposed at each corner of the triangular shape. The connection tips 55*b* of the eighth modified example are formed larger than the connection tips 55*b* of the first modified example, and may be, for example, about 2.76% as compared with the planar area of the light emitting device 10.

Referring to FIG. 9I, in a ninth modified example, four connection tips 55*b* are formed in the light emitting device 10, which are disposed at locations overlapping with the first and second electrode pads 31 and 33. Two of the four connection tips 55*b* are disposed at locations overlapping with the first electrode pad 31, and the other two are disposed at locations overlapping with the second electrode pad 33. The connection tips 55*b* of the ninth modified example may be formed to have substantially a triangular shape. A total area of the connection tips 55*b* may be, for example, about 1.68% as compared with the planar area of the light emitting device 10.

Referring to FIG. 9J, in a tenth modified example, three connection tips 55*b* are formed in the light emitting device 10, which are disposed at locations overlapping with the first and second electrode pads 31 and 33. One of the three connection tips 55*b* is disposed at a location overlapping with the first electrode pad 31, and the other two are disposed at a location overlapping with the second electrode pad 33. A total area of the connection tips 55*b* may be, for example, about 1.26% as compared with the planar area of the light emitting device 10.

Referring to FIG. 9K, in an eleventh modified example, three connection tips 55*b* are formed in the light emitting device 10. The connection tips 55*b* are disposed at locations overlapping with the first and second electrode pads 31 and 33. Two of the three connection tips 55*b* are disposed at locations overlapping with the first electrode pad 31, and the remaining one is disposed at a location overlapping with the second electrode pad 33. A total area of the connection tips 55*b* may be, for example, about 1.26% as compared with the planar area of the light emitting device 10.

Referring to FIG. 9L, in a twelfth modified example, a connection tip 55*b* formed in the light emitting device 10 is disposed between the first and second electrode pads 31 and 33. The connection tip 55*b* includes a base 55*ba* having a longitudinal length perpendicular to a direction in which the first and second electrode pads 31 and 33 are disposed, a first extension 55*bb* disposed at one longitudinal end of the base 55*ba* and extending toward the first electrode pad 31, and a second extension 55*bc* disposed at the remaining longitudinal end of the base 55*ba* and extending toward the second electrode pad 33. Each of the first and second extensions 55*bb* and 55*bc* may be formed to have a shape having a narrower width as a distance from the base 55*ba* increases.

A total area of the connection tip 55*b* may be, for example, about 1.92% as compared with the planar area of the light emitting device 10.

Referring to FIG. 9M, in a thirteenth modified example, a connection tip 55*b* formed in the light emitting device 10 is disposed between the first and second electrode pads 31 and 33. The connection tip 55*b* includes a base 55*ba* having a longitudinal length perpendicular to a direction in which the first and second electrode pads are disposed, a first extension 55*bb* extending toward the first electrode pad 31 from a center of the base 55*ba*, and a second extension 55*bc* extending toward the second electrode pad 33 from a center of the base 55*ba*. Each of the first and second extensions 55*bb* and 55*bc* may be formed in a shape having a narrower width as a distance from the base 55*ba* increases.

A total area of the connection tip 55*b* may be, for example, about 1.161% as compared with the planar area of the light emitting device 10.

Referring to FIG. 9N, in a fourteenth modified example, four connection tips 55*b* are formed in the light emitting device 10. Two of the four connection tips 55*b* are disposed at locations overlapping with the first and second electrode pads 31 and 33, and the other two are disposed between the first and second electrode pads 31 and 33. The connection tips 55*b* disposed on the first and second electrode pads 31 and 33 may be disposed at an edge of the first and second electrode pads 31 and 33, respectively. The connection tip 55*b* overlapped with the first electrode pad 31 may be disposed at a location close to the second electrode pad 33 from the first electrode pad 31, and the connection tip 55*b* overlapped with the second electrode pad 33 may be disposed at a location close to the first electrode pad 31 from the second electrode pad 33. A total area of the four connection tips 55*b* may be, for example, about 0.49% as compared with the planar area of the light emitting device 10.

Referring to FIG. 9O, in a fifteenth modification, four connection tips 55*b* are formed in the light emitting device 10. One connection tip of the four connection tips 55*b* is disposed at approximately a center of the light emitting device 10, two connection tips 55*b* are disposed at locations overlapping with the second electrode pad 33, and the remaining one connection tip 55*b* is disposed at a location overlapping with the first electrode pad 31. Three connection tips 55b may be disposed in a triangular shape near outline of the light emitting device, and the connection tip 55b disposed at the center of the light emitting device 10 may be located in the triangle formed by the three connection tips 55b.

The two connection tips 55b disposed at the locations overlapping with the second electrode pad 33 may be disposed near edges of the second electrode pad 33, respectively, and may be disposed to face each other with respect to an elongated straight line passing through the center.

The connection tip 55b disposed at the location overlapping with the first electrode pad 31 may be disposed near one edge of the first electrode pad 31, and may be disposed away from the elongated straight line passing through the center.

Each of the connection tips 55b may have substantially a right triangular shape, and the connection tip 55b disposed at the center of the light emitting device 10 may be disposed in a direction which is opposite to a direction in which the other connection tips 55b are disposed as shown in the drawing.

When the light emitting devices 10 are separated from the connection portion 55 using the connection tips 55b, the connection tip 55b overlapped with the first electrode pad 31 may be first formed, the connection tip 55b near the center may be formed next, and the connection tips 55b overlapped with the second electrode pad 33 may be formed last. As such, the light emitting devices 10 may be easily separated from the connection portion 55, and cracks which may otherwise occur in the light emitting devices 10 may be prevented.

When picking up or mounting the light emitting device 10, the light emitting device 10 may be unstably picked up or mounted depending on the location of the connection tips, and thus, cracks may occur. According to an exemplary embodiment, since the connection tips 55b are disposed on both edges of the light emitting device 10 and near the center of the light emitting device 10, respectively, the light emitting device 10 may be picked up or mounted stably to prevent cracks which may otherwise be generated in the light emitting device 10.

A total area of the four connection tips 55b may be, for example, about 0.8% as compared with the planar area of the light emitting device 10 according to the exemplary embodiment.

Table 1 shows a comparison between area ratios of the connection tips 55b and success probabilities of picking up the light emitting device 10 depending on areas of the connection tips 55b formed in the light emitting device 10 as described above.

TABLE 1

| | Area ratio (Based on the area of the light emitting device) | Pickup success rate of the light emitting device |
|---|---|---|
| 1st Modified Example | 1.26% | Not less than 50% |
| 2nd Modified Example | 0.65% | Good |
| 3rd Modified Example | 1.22% | Not less than 50% |
| 4th Modified Example | 1.22% | Not less than 50% |
| 5th Modified Example | 2.71% | Bad |
| 6th Modified Example | 2.71% | Bad |
| 7th Modified Example | 0.58% | Good |
| 8th Modified Example | 2.76% | Bad |
| 9th Modified Example | 1.68% | Less than 50% |
| 10th Modified Example | 1.26% | Not less than 50% |
| 11th Modified Example | 1.26% | About 50% |

TABLE 1-continued

| | Area ratio (Based on the area of the light emitting device) | Pickup success rate of the light emitting device |
|---|---|---|
| 12th Modified Example | 1.92% | Less than 50% |
| 13th Modified Example | 1.61% | Less than 50% |
| 14th Modified Example | 0.49% | Good |
| 15th Modified Example | 0.8% | Good |

Through the first to fifteenth modified examples, it is confirmed that the pick-up success rate of the light emitting devices 10 is satisfactory when the area ratio of the connection tips 55b is, for example, about 1.2% or less as compared with the planar area of the light emitting device 10.

Figure 10:
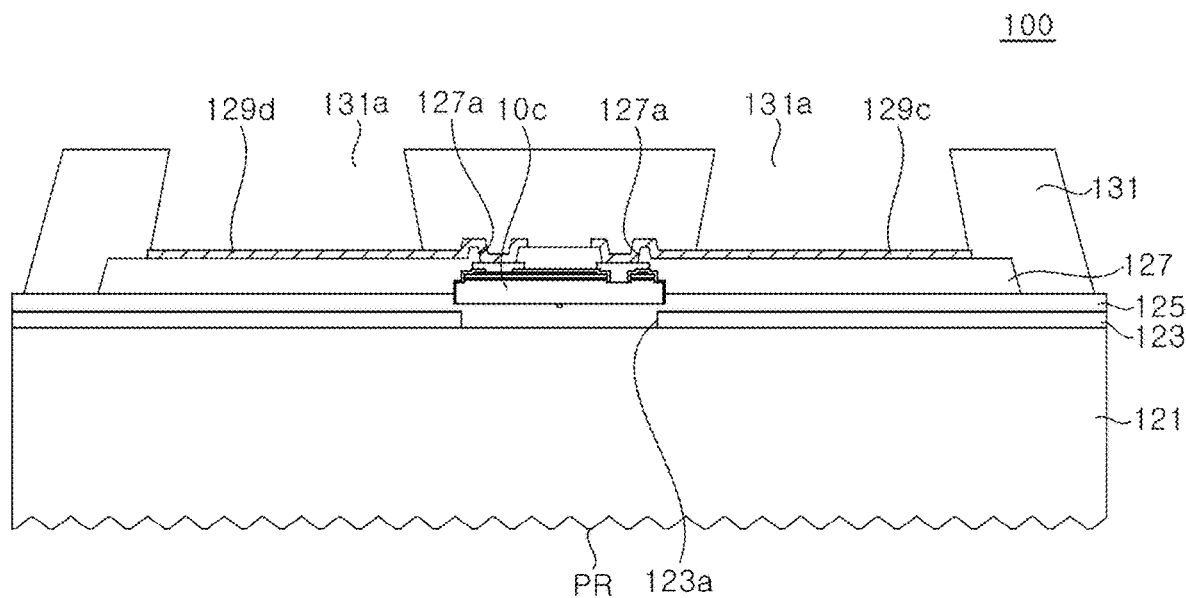
FIG. 10 is a schematic cross-sectional view illustrating a unit pixel according to another exemplary embodiment.

FIG. 10 is a schematic cross-sectional view illustrating a unit pixel 100a according to another exemplary embodiment.

Referring to FIG. 10, the unit pixel 100a according to the illustrated exemplary embodiment may be substantially similar to the unit pixel 100 described with reference to FIGS. 3A and 3B, except that the bumps 133a, 133b, 133c, and 133d are omitted.

A protection layer 131 has openings 131a exposing connection layers 129a, 129b, 129c, and 129d. The openings 131a are disposed to correspond to the locations of the bumps 133a, 133b, 133c, and 133d of the unit pixel 100 described with reference to FIGS. 3A and 3B.

As the bumps shown in FIGS. 3A and 3B are omitted in the illustrated exemplary embodiment, a thickness of the protection layer 131 is about ½ or less of a thickness of the protection layer 131 in the unit pixel 100 of FIGS. 3A and 3B, and, further, may be about ⅓ or less. For example, the thickness of the protection layer 131 in the unit pixel 100 of FIGS. 3A and 3B may be about 45 µm, and the thickness of the protection layer 131 according to the illustrated exemplary embodiment may be about 15 µm.

Figure 11:
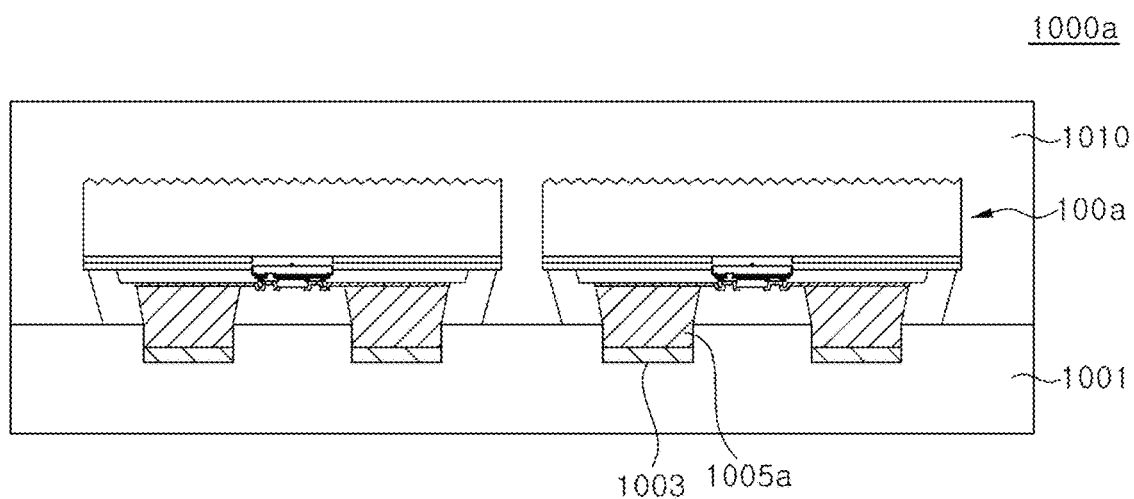
FIG. 11 is a schematic cross-sectional view illustrating a pixel module according to another exemplary embodiment.

FIG. 11 is a schematic cross-sectional view illustrating a pixel module 1000a according to another exemplary embodiment. Hereinafter, the pixel module 1000a in which the unit pixels 100a of FIG. 10 are mounted will be described.

Referring to FIG. 11, the pixel module 1000a according to the illustrated exemplary embodiment is generally similar to the pixel module 1000 described with reference to FIGS. 4A and 4B, except that bonding material 1005 fills openings 131a of a protection layer 131 because the unit pixel 100a does not have bumps. The bonding material 1005 may completely fill the openings 131a of the protection layer 131, or may partially fill the openings 131a of the protection layer 131. When the bonding material 1005 partially fills the openings 131a of the protection layer 131, a cavity may be formed in the openings 131a.

A displaying apparatus 10000 may be provided by arranging a plurality of pixel modules 1000a on a panel substrate 2100.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus, comprising:
a panel substrate; and
a pixel module disposed on the panel substrate, the pixel module including:
 a circuit board, and
 a plurality of light emitters longitudinally extending along a first direction and disposed on the circuit board, wherein:
each light emitter of the plurality of light emitters comprises:
 a light emitting layer including a first conductivity type semiconductor layer, a second conductivity type semiconductor layer, and an active layer interposed between the first and second conductivity type semiconductor layers;
 a first connection layer electrically connected to the first conductivity type semiconductor layer;
 a second connection layer electrically connected to the second conductivity type semiconductor layer; and
 a step adjustment layer disposed between the circuit board and the light emitting layer and covering a region of the light emitting layer,
the plurality of light emitters in the pixel module are arranged and aligned in a second direction crossing the first direction, and
the step adjustment layer includes an opening region that provides an electrical contact region between the first connection layer and the first conductivity type semiconductor layer.

2. The display apparatus of claim 1, further comprising a light blocking layer disposed on the panel substrate.

3. The display apparatus of claim 2, wherein the light blocking layer has a window region to transmit light generated in at least one light emitter of the plurality of light emitters.

4. The display apparatus of claim 1, further comprising a cover layer covering the plurality of light emitters.

5. The display apparatus of claim 4, further comprising a light blocking layer disposed between at least two light emitters of the plurality of light emitters.

6. The display apparatus of claim 5, wherein the light blocking layer has a window region to transmit light generated in at least one of the light emitters.

7. The display apparatus of claim 1, further comprising a protection layer covering the step adjustment layer, the first connection layer, and the second connection layer,
wherein the protection layer has a first opening formed on the first connection layer and a second opening formed on the second connection layer.

8. The display apparatus of claim 7, further comprising:
a first bump disposed in the first opening; and
a second bump disposed in the second opening, wherein:
the first bump is electrically connected to the first connection layer, and
the second bump is electrically connected to the second connection layer.

9. A display module, comprising:
a substrate;
a light blocking layer disposed on the substrate; and
a pixel module arranged on the substrate, the pixel module including a plurality of light emitters disposed on the substrate, wherein:
each light emitter of the plurality of light emitters longitudinally extends along a first direction and comprises:
 a light emitting layer including a first conductivity type semiconductor layer, a second conductivity type semiconductor layer, and an active layer interposed between the first and second conductivity type semiconductor layers;
 a first connection layer electrically connected to the first conductivity type semiconductor layer;
 a second connection layer electrically connected to the second conductivity type semiconductor layer; and
 a step adjustment layer disposed between the substrate and the light emitting layer,
the light blocking layer includes a window region to transmit light generated in at least one light emitter of the plurality of light emitters, and
the plurality of light emitters in the pixel module are arranged and aligned in a second direction crossing the first direction.

10. The display module of claim 9, wherein the light blocking layer is disposed between at least two light emitters of the plurality of light emitters.

11. The display module of claim 9, further comprising a cover layer covering the plurality of light emitters.

12. The display module of claim 9, further comprising a protection layer covering the step adjustment layer, the first connection layer, and the second connection layer,
wherein the protection layer has a first opening formed on the first connection layer and a second opening formed on the second connection layer.

13. The display module of claim 12, further comprising:
a first bump disposed in the first opening; and
a second bump disposed in the second opening, wherein:
the first bump is electrically connected to the first connection layer, and
the second bump is electrically connected to the second connection layer.

14. A light module, comprising:
a substrate; and
a plurality of light emitters disposed on the substrate, and
a blocking layer disposed on the substrate, wherein:
each light emitter of the plurality of light emitters longitudinally extends along a first direction and arranged on the substrate and comprises:
 a light emitting layer including a first conductivity type semiconductor layer, a second conductivity type semiconductor layer, and an active layer interposed between the first and second conductivity type semiconductor layers;
 a first connection layer electrically connected to the first conductivity type semiconductor layer;
 a second connection layer electrically connected to the second conductivity type semiconductor layer; and
 an adhesive layer disposed on the substrate and covering a region of the light emitting layer,
the light blocking layer includes a window region to transmit light generated in at least one light emitter of the plurality of light emitters, and
the plurality of light emitters is arranged and aligned in a second direction crossing the first direction.

15. The light module of claim 14, wherein the step adjustment layer includes a first opening region that provides a first electrical contact region between the first connection layer and the first conductivity type semiconductor layer.

16. The light module of claim 14, wherein the step adjustment layer includes a second opening region that provides a second electrical contact region between the second connection layer and the second conductivity type semiconductor layer.

17. The light module of claim 14, wherein the light blocking layer is disposed between at least two light emitters of the plurality of light emitters.

18. The light module of claim 14, further comprising a cover layer covering the plurality of light emitters.

19. The light module of claim 14, further comprising a protection layer covering the step adjustment layer, the first connection layer, and the second connection layer,
- wherein the protection layer has a first opening formed on the first connection layer and a second opening formed on the second connection layer.

20. The light module of claim 19, further comprising:
a first bump disposed in the first opening; and
a second bump disposed in the second opening, wherein:
the first bump is electrically connected to the first connection layer, and
the second bump is electrically connected to the second connection layer.

\* \* \* \* \*